United States Patent
Shukla

(10) Patent No.: US 8,816,211 B2
(45) Date of Patent: *Aug. 26, 2014

(54) ARTICLES WITH PHOTOCURABLE AND PHOTOCURED COMPOSITIONS

(75) Inventor: Deepak Shukla, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 355 days.

This patent is subject to a terminal disclaimer.

(21) Appl. No.: 13/026,365

(22) Filed: Feb. 14, 2011

(65) Prior Publication Data

US 2012/0205140 A1 Aug. 16, 2012

(51) Int. Cl.
| | | |
|---|---|---|
| H05K 1/00 | (2006.01) | |
| C08F 2/48 | (2006.01) | |
| H05K 3/28 | (2006.01) | |
| G03F 7/029 | (2006.01) | |
| C09D 4/06 | (2006.01) | |
| C09D 4/00 | (2006.01) | |
| C08F 222/10 | (2006.01) | |
| C08F 220/06 | (2006.01) | |
| C08F 220/14 | (2006.01) | |
| H05K 3/02 | (2006.01) | |
| H05K 3/00 | (2006.01) | |

(52) U.S. Cl.
CPC ......... G03F 7/029 (2013.01); *C08F 2222/1013* (2013.01); *C08F 220/06* (2013.01); *C08F 2222/1026* (2013.01); *C08F 2222/1053* (2013.01); C08F 2/48 (2013.01); *C08F 220/14* (2013.01); *H05K 3/022* (2013.01); H05K 3/287 (2013.01); *H05K 3/0076* (2013.01); C09D 4/06 (2013.01); C09D 4/00 (2013.01)
USPC ............... 174/250; 252/500; 347/7; 359/891; 425/385; 425/436 R; 428/172; 430/5; 430/7; 430/138; 430/281.1; 430/284.1; 430/286.1; 522/17; 522/18; 522/25; 522/26; 522/29; 526/217

(58) Field of Classification Search
USPC ............... 174/250; 252/500; 347/7; 359/891; 425/385, 436 R; 428/172; 430/5, 7, 430/138, 281.1, 284.1, 286.1; 522/17, 18, 522/25, 26, 29; 526/217
See application file for complete search history.

(56) References Cited

U.S. PATENT DOCUMENTS

| | | | | |
|---|---|---|---|---|
| 4,264,483 A | * | 4/1981 | Laufer et al. ................. 522/10 |
| 4,720,392 A | * | 1/1988 | Livesay ........................ 427/508 |
| 4,743,528 A | * | 5/1988 | Farid et al. ................. 430/281.1 |
| 4,904,536 A | * | 2/1990 | Livesay ........................ 428/515 |
| 4,940,645 A | * | 7/1990 | Davis et al. ................... 430/138 |
| 5,026,625 A | * | 6/1991 | Riediker et al. ........... 430/281.1 |
| 5,068,371 A | * | 11/1991 | Steiner et al. ................... 556/53 |
| 5,328,805 A | * | 7/1994 | Huynh-Tran et al. ...... 430/284.1 |
| 5,362,605 A | * | 11/1994 | Mirle et al. ................. 430/284.1 |
| 5,494,943 A | * | 2/1996 | Mahoney et al. ............... 522/66 |
| 5,672,637 A | * | 9/1997 | Mahoney et al. ............... 522/25 |
| 5,698,371 A | * | 12/1997 | Mirle et al. ................. 430/284.1 |
| 5,853,470 A | * | 12/1998 | Martin et al. ............... 106/31.86 |
| 5,942,556 A | * | 8/1999 | Friedlander et al. ............. 522/76 |
| 6,046,250 A | * | 4/2000 | Boardman et al. ............... 522/29 |
| 6,086,795 A | * | 7/2000 | Hatton .......................... 252/582 |
| 6,106,999 A | * | 8/2000 | Ogiso et al. ................ 430/281.1 |
| 6,265,459 B1 | * | 7/2001 | Mahoney et al. ............... 522/17 |
| 6,423,472 B1 | * | 7/2002 | Kumpfmiller et al. .... 430/284.1 |
| 6,447,708 B1 | * | 9/2002 | Thepot et al. ................. 264/496 |
| 6,482,868 B1 | * | 11/2002 | Mahoney et al. ............... 522/17 |
| 6,489,374 B1 | * | 12/2002 | Baudin et al. .................. 522/26 |
| 6,551,761 B1 | * | 4/2003 | Hall-Goulle et al. ...... 430/284.1 |
| 6,586,507 B2 | * | 7/2003 | Galbo et al. .................. 524/102 |
| 6,610,759 B1 | * | 8/2003 | Chappelow et al. ............ 522/25 |
| 6,657,001 B1 | * | 12/2003 | Anderson et al. ............. 524/588 |
| 6,692,611 B2 | * | 2/2004 | Oxman et al. ............. 156/275.5 |
| 6,872,832 B2 | * | 3/2005 | Galbo et al. .................. 546/207 |
| 7,629,400 B2 | * | 12/2009 | Hyman ........................ 524/106 |
| 7,878,644 B2 | * | 2/2011 | LaFleche et al. ............. 347/102 |
| 2001/0012596 A1 | * | 8/2001 | Kunimoto et al. ............ 430/138 |
| 2002/0020832 A1 | * | 2/2002 | Oka et al. ...................... 252/500 |
| 2002/0117080 A1 | * | 8/2002 | Okutsu et al. ............. 106/31.78 |
| 2002/0132873 A1 | * | 9/2002 | Papathomas et al. ........... 522/66 |
| 2003/0119932 A1 | * | 6/2003 | Al-Akhdar et al. ............ 522/18 |
| 2003/0224169 A1 | * | 12/2003 | Kobayashi et al. ............ 428/408 |
| 2003/0232275 A1 | * | 12/2003 | Kobayashi et al. ......... 430/270.1 |
| 2004/0126690 A1 | * | 7/2004 | Kobayashi et al. ............. 430/97 |
| 2004/0146806 A1 | * | 7/2004 | Roberts et al. ............. 430/287.1 |
| 2004/0170924 A1 | * | 9/2004 | Kunimoto et al. ......... 430/281.1 |
| 2005/0129859 A1 | * | 6/2005 | Misev et al. ................. 427/384 |
| 2005/0146544 A1 | * | 7/2005 | Kondo ............................ 347/7 |
| 2005/0191567 A1 | * | 9/2005 | Kunimoto et al. ............... 430/7 |
| 2006/0035065 A1 | * | 2/2006 | Kobayashi et al. ........... 428/195.1 |
| 2006/0241259 A1 | * | 10/2006 | Tanabe et al. ................. 526/217 |

(Continued)

FOREIGN PATENT DOCUMENTS

DE  25 28 358  1/1976

OTHER PUBLICATIONS

U.S. Appl. No. 13/026,355, filed Feb. 14, 2011, entitled "Photoinitiator Compositions and Uses" by D. Shukla.

(Continued)

*Primary Examiner* — Xiaoliang Chen
(74) *Attorney, Agent, or Firm* — J. Lanny Tucker

(57) ABSTRACT

The photocuring efficiency of a photoinitiator is increased by mixing it with an organic phosphite and an aldehyde. This mixture or photoinitiator composition can be used to cure acrylates or other photocurable compounds, particularly in an oxygen-containing environment, and the photocurable compositions can be used to form various articles.

18 Claims, No Drawings

(56) References Cited

U.S. PATENT DOCUMENTS

| | | | |
|---|---|---|---|
| 2006/0287408 A1* | 12/2006 | Baikerikar et al. | 522/71 |
| 2007/0009714 A1* | 1/2007 | Lee et al. | 428/172 |
| 2007/0109382 A1* | 5/2007 | Lafleche et al. | 347/102 |
| 2007/0110958 A1* | 5/2007 | Meyers et al. | 428/141 |
| 2007/0203296 A1* | 8/2007 | Okada et al. | 525/166 |
| 2007/0275255 A1* | 11/2007 | Ooms et al. | 428/447 |
| 2009/0061039 A1* | 3/2009 | Zhang et al. | 425/436 R |
| 2009/0104562 A1* | 4/2009 | Williamson | 430/285.1 |
| 2009/0142876 A1* | 6/2009 | Tuan et al. | 438/70 |
| 2009/0197987 A1* | 8/2009 | Hayoz et al. | 522/17 |
| 2009/0208872 A1* | 8/2009 | Wolf et al. | 430/286.1 |
| 2009/0292075 A1* | 11/2009 | Tamai et al. | 525/221 |
| 2010/0087563 A1* | 4/2010 | Hayoz et al. | 522/25 |
| 2010/0136467 A1* | 6/2010 | Matsumoto et al. | 430/7 |
| 2010/0188765 A1* | 7/2010 | Matsumoto et al. | 359/891 |
| 2010/0272920 A1* | 10/2010 | Garnett | 427/551 |
| 2010/0286353 A1* | 11/2010 | Nakayama et al. | 526/262 |
| 2010/0297540 A1* | 11/2010 | Hayoz et al. | 430/5 |
| 2010/0297541 A1* | 11/2010 | Hayoz et al. | 430/5 |
| 2010/0297542 A1* | 11/2010 | Hayoz et al. | 430/7 |
| 2010/0316828 A1* | 12/2010 | Baikerikar et al. | 428/38 |
| 2011/0096274 A1* | 4/2011 | Shimizu et al. | 349/106 |
| 2011/0104321 A1* | 5/2011 | Zhang et al. | 425/385 |
| 2011/0123929 A1* | 5/2011 | Fujita et al. | 430/281.1 |
| 2011/0151146 A1* | 6/2011 | Okano et al. | 428/1.33 |

OTHER PUBLICATIONS

U.S. Appl. No. 13/026,360, filed Feb. 14, 2011, entitled "Photocurable Inks and Methods of Use" by D. Shukla.

U.S. Appl. No. 13/026,372, filed Feb. 14, 2011, entitled "Methods of Photocuring and Imaging" by D. Shukla.

U.S. Appl. No. 13/026,380, filed Feb. 14, 2011, entitled "Photocurable Inks With Aldehydes and Methods of Use" by D. Shukla.

* cited by examiner

ARTICLES WITH PHOTOCURABLE AND PHOTOCURED COMPOSITIONS

FIELD OF THE INVENTION

This invention relates to articles comprising photocurable compositions that can be cured using actinic radiation. In particular, the photocurable compositions are curable in the presence of oxygen. In addition, this invention provides articles having cured coatings, patterns, or images obtained from the photocurable compositions.

BACKGROUND OF THE INVENTION

Natural and synthetic polymers have served essential needs in society. However, in recent times synthetic polymers have played an increasingly greater role, particularly since the beginning of the 20th century. Such synthetic polymers are commonly prepared by an addition polymerization mechanism, that is, free radical chain polymerization of unsaturated monomers. The majority of commercially significant processes are based on free-radical chemistry, or chain polymerization that is initiated by a reactive species, which often is a free radical. The source of the free radicals is termed an initiator or photoinitiator.

Photochemically induced polymerization reactions have become of great importance in industry, in particular for rapid curing of thin films, such as, for example, in the curing of paint coatings and plastic coatings on paper, wood, metal, and plastic or in the drying of printing inks. This curing by irradiation in the presence of photoinitiators is distinguished, compared with conventional methods for the drying or curing of coatings, by saving of materials and energy, low thermal stress of the substrate, and in particular a high curing rate. Moreover, the preparation of polymer materials by polymerization of the corresponding unsaturated monomeric starting materials is often carried out photochemically and by means of photoinitiators in such conventional processes as solution and emulsion polymerization. Since in the reactions mentioned, none of the reactants is usually capable of absorbing a sufficient amount of the photochemically active radiation, it is necessary to add photoinitiators.

Improvements in free radical chain polymerization have been focused both on the polymer being produced and the photoinitiator. Whether a particular unsaturated monomer can be converted to a polymer requires structural, thermodynamic, and kinetic feasibility. Even when all three properties are present, kinetic feasibility is achieved in many cases only with a specific type of photoinitiator. Moreover, the photoinitiator can have a significant effect on reaction rate, which, in turn, can determine the commercial success or failure of a particular polymerization process or product.

The primary function of a photoinitiator is to generate free radicals when the photoinitiator is irradiated with light of appropriate energy or wavelength. Photoinitiators are classified into "Type I" (or photocleavage) photoinitiators and "Type II" (or H-abstraction) photoinitiators according to the pathways by which the effective initiating radicals are generated.

In contrast to photocleavage photoinitiators that are decomposed by light directly into radicals that are effective in initiating polymerization, Type II photoinitiators require a hydrogen donor, or more generally a source of abstractable hydrogen's in order to generate radicals that are effective in initiating polymerization. The process of H-abstraction is usually a bimolecular reaction requiring the encounter of a photoinitiator and a hydrogen-donor. Any source of abstractable hydrogen's can be useful (for example, any structure that yields a stable radical after H-abstraction may serve as an "H donor") and such sources include amines, thiols, unsaturated rubbers such as polybutadiene or polyisoprene, and alcohols.

Type I photoinitiators can generate free radical either of the two following mechanisms:

(1) the photoinitiator undergoes excitation by energy absorption with subsequent decomposition into one or more radicals, or (2) a sensitizer molecule absorbs light and the excited sensitizer then transfers energy to the photoinitiator to generate free radicals.

The basic photochemistry and photophysics of both Type I and Type II photoinitiators have been well studied and utilized industrially in UV curable systems (see for example, Turro, N.J., Modern Molecular Photochemistry, 1991, University Science Books, chapters 7, 10, and 13.).

A number of Type I photoinitiators are commonly used in a variety of photocuring related applications and are commercially available. Among Type I photoinitiators, the hydroxyalkylphenone photoinitiators have proven to be particularly useful. Such photoinitiators include but are not limited to, benzoin ethers, benzil monoketals, dialkoxyacetophenones, hydroxyalkylphenones, and derivatives derived from these classes of compounds. α-Amino arylketones are also commonly used as Type I photoinitiators and are commercially available as are mono- and bis-acylphosphine oxides.

Most known photoinitiators (both Type I and II) have only moderate quantum yields (generally less than 0.5), indicating that the conversion of light radiation to radical formation needs to be made more efficient. The overall efficiency of photocuring process, in addition to overall composition of polymerizable material(s), depends on the quantum yield of radical generation of photoinitiator. To increase the overall efficiency of a photocuring, improvements in photoinitiators, as well as improvements in photoinitiating compositions, are necessary. In some cases, the commercial viability of certain systems can depend on whether a relatively modest improvement, for example, in the 2 to 10 times range, can be achieved. Improving photocuring efficiency is especially critical since with increasing diversification and specialization of processes and products in the area of coating techniques using polymer materials and, more and more frequent requirement of providing tailor-made solutions for these problems, increasingly requires higher and more specific demands on the photoinitiators and photoinitiating compositions. Therefore, in many cases, known photoinitiators do not fulfill, or at least not to an optimum degree, the demand made on them today. In most practical applications major, problems include the need to achieve even maximum (or theoretical) photoinitiator efficiency. These problems arise, for example:

(a) due to inefficient light absorption in pigmented systems, (b) lack of compatibility with a wide range of binder systems and their reactive components and other modifying additives, or (c) the storage instability in the dark of the systems containing the photoinitiator and the possible deterioration in the quality of the cured final product, such as yellowing, as a result of unconverted initiator residues and initiator degradation products.

Besides these challenges, there is an additional challenge of free radical photocuring inhibition by the presence of oxygen. Oxygen inhibition has always been a major problem for photocuring of acrylate-containing compositions containing multifunctional acrylate monomers or oligomers using a photoinitiated radical polymerization (for example, see Decker et al., *Macromolecules* 18 (1985) 1241.). Oxygen inhibition is due to the rapid reaction of carbon centered propagating radicals with oxygen molecules to yield peroxyl radicals. These peroxyl radicals are not as reactive towards carbon-carbon unsaturated double bonds and therefore do not initiate or participate in any photopolymerization reaction. Oxygen inhibition usually leads to premature chain termination, resulting in incomplete photocuring. Thus, many photocuring processes must be carried out in inert environments (for example, under nitrogen or argon), making such processes more expensive and difficult to use in industrial and laboratory settings.

Various methods have been proposed to overcome oxygen inhibition of photocuring:

(1) Amines that can undergo a rapid peroxidation reaction can be added to consume the dissolved oxygen. However, the presence of amines in acrylate-containing compositions can cause yellowing in the resulting photocured composition, create undesirable odors, and soften the cured composition because of chain transfer reactions. Moreover, the hydroperoxides thus formed will have a detrimental effect on the weathering resistance of the UV-cured composition.

(2) Dissolved oxygen can be converted into its excited singlet state by means of a red light irradiation in the presence of a dye sensitizer. The resulting $^1O_2$ radical will be rapidly scavenged by a 1,3-diphenylisobenzofuran molecule to generate a compound (1,2-dibenzoylbenzene) that can work as a photoinitiator (Decker, *Makromol. Chem.* 180 (1979), p. 2027). However, the photocured composition can become colored, in spite of the photobleaching of the dye, prohibiting this technique for use in various products.

(3) The photoinitiator concentration can be increased to shorten the UV exposure during which atmospheric oxygen diffuses into the cured composition. This technique can also be used in combination with higher radiation intensities. Oxygen inhibition can further be reduced by using high intensity flashes that generate large concentrations of initiator radicals reacting with oxygen, but hydroperoxides are also formed.

(4) Free radical photopolymerization can be carried out under inert conditions (Wight, *J Polym. Sci.: Polym. Lett. Ed.* 16 (1978) 121), which is the most efficient way to overcome oxygen inhibition. Nitrogen is typically continuously used to flush the photopolymerizable composition during UV exposure. On an industrial UV-curing line, which cannot be made completely airtight, nitrogen losses can be significant, thus making the process expensive and inefficient. This is an even greater concern if argon is used to provide an inert environment.

Other less common ways of overcoming oxygen inhibition of acrylate photopolymerization include using a wax barrier and performing UV exposure under water. Each of these techniques has disadvantages that have made them less likely for commercial application.

The use of phosphites as antioxidants and stabilizers in polymeric compositions is known. For example U.S. Patent Application Publication 2004/0157949 A1 (Hu, [0058]) discloses the use of phosphites along with hindered amines and phenols as stabilizers in photocurable compositions. U.S. Patent Application Publication 2006/0173089 A1 (Jackson, [0026]) discloses the use of phosphites, hindered phenols, and hindered amines, antioxidant stabilizers in radiation-crosslinked polyolefin compositions. This publication also teaches that the use of some of these antioxidants in "excessive amount" can act as "radiation scavengers" and thus reduce effectiveness of photocuring. U.S. Patent Application Publication 2009/0292040 A1 (Sarmah) discloses the use of phosphites and hindered phenols as antioxidants in radiation curable liquid resins. None of these publications suggests that phosphites can be used with photoinitiators in photocurable compositions.

Phosphite stabilizers, for example, hindered neoalkyl phosphite compositions as disclosed in U.S. Pat. No. 5,464,889 (Mahood) exhibit undesirable odors, which make their handling and processing unpleasant and perhaps hazardous. Reducing the odors of phosphites would be an advance in the art for any use. It is clear from this discussion that in photopolymerization technology, there are continuing opportunities for improvements in free radical polymerization processes and photoinitiators. Moreover, there is a need in the art for new, energy-efficient photoinitiator compositions that can be used for use in a variety of polymerization and photocuring processes to prepare various articles in the presence of oxygen. The need for highly efficient photoinitiating compositions is particularly acute where absorption of light by the reaction medium may limit the amount of energy available for absorption by the photoinitiators. For example, in the preparation of color filter resists, highly pigmented resists are required for high color quality. With the increase in pigment content, the curing of color resists becomes more difficult. Hence, there is a need for photoinitiating compositions having a higher sensitivity and excellent resolution properties. In addition, there is a need for articles prepared from such photoinitiating compositions and articles containing such photoinitiator compositions to meet the industrial properties such as high solubility, thermal stability, and storage stability.

SUMMARY OF THE INVENTION

The present invention provides an article comprising a photocurable composition that comprises at least one photoinitiator, at least one organic phosphite, at least one aldehyde, and at least one photocurable compound.

Another embodiment of this invention is an article having a photocured composition, which article is obtained by irradiating the photocurable composition described herein.

A method of this invention for providing the article of this invention comprises:

providing an article comprising a photocurable composition that comprises at least one photoinitiator, at least one organic phosphite, at least one aldehyde, and at least one photocurable compound, and irradiating the photocurable composition.

The present invention addresses some of the difficulties and problems that are discussed above with energy-efficient photoinitiator compositions that can be used in photocurable compositions, articles, and methods of photocuring in various industrial applications. One of the primary advantages of the present invention is that when the photocurable composition has more rapid curing times. Moreover, such rapid curing can be achieved in air or in the presence of oxygen as well as in inert environments. Rapid curing in air is particularly advantageous since, as described above, oxygen usually inhibits curing.

The photoinitiator compositions used in this invention can generate free radical species upon irradiation, for example under extremely low energy lamps, such as excimer lamps and mercury lamps, as compared to known photoinitiators alone. Further, the photoinitiator compositions used in the present invention can be as much as 200 times faster that the best prior art photocurable compositions.

It was surprising to me that the use of the organic phosphite used in the photocurable compositions used in this invention provide unexpectedly better performance in photocuring than use of known Type I or Type II photoinitiators alone, even in the presence of oxygen.

I have also found that combining an organic phosphite with an aldehyde in the photocurable compositions surprisingly reduced unpleasant odors from the organic phosphites. Aldehydes, in equilibrium, are known to form 1:1 adducts with phosphites (F. Ramirez, *Pure Appl. Chem.* 1964, 9(2), 337-369). These 1:1 phosphite-aldehydes adducts could further react with additional aldehyde to form cyclic tetralkoxyphosphoranes. Both 1:1 phosphite-aldehyde adducts as well as cyclic tetralkoxyphosphorane are useful in the photocurable compositions. In the case of a molar excess of certain aliphatic aldehydes, 1:1, 1:2, 1:3, or greater of phosphite-aldehyde adducts are possible (F. Ramirez, *Pure Appl. Chem.* 1964, 9(2), 337-369).

These and other features and advantages of the present invention will become apparent after a review of the following detailed description of the disclosed embodiments and the appended claims.

DETAILED DESCRIPTION OF THE INVENTION

The photoinitiator compositions used in the present invention comprise at least one wavelength-specific photoinitiator, at least one organic phosphite compound, and at least one aldehyde. The photoinitiator compositions need no other components that are essential to photoinitiation or the creation of free radicals. However, as noted below, the compositions can optionally include photosensitizers that adjust or sharpen the spectral sensitivity of the photoinitiator to photocuring radiation. Thus, addenda can be present that are not needed for free radical generation but that relate to functions other than photoinitiating. A skilled worker would understand that with routine experimentation, the combination of photoinitiator, organic phosphite, and aldehyde can be varied in type and amount of the compounds to optimize the efficacy of photoinitiator composition with a given photocurable compound.

The photoinitiator compositions are useful in methods of polymerizing or photocuring a photocurable compound, for example as part of an article or in the formation of an article. For example, the photoinitiator compositions can be used in a method of photocuring or polymerizing one or more ethylenically unsaturated polymerizable monomers, oligomers, or crosslinkable polymers by exposing these photocurable compounds to suitable radiation in the presence of the photoinitiator compositions.

The photoinitiator and photocurable compositions can be used to form films or coatings in articles, for example by providing a mixture of one or more photocurable compounds and a photoinitiator composition as a photocurable composition in a film or a coating and irradiating the film or coating with a suitable amount of radiation sufficient to cure or polymerize the film or coating. The photocurable composition can be coated or applied in some manner onto a substrate to form an article, which article can be in various forms including fibers, fabrics, films, patterned or patternable substrates, and other forms that would be readily apparent to one skilled in the art.

Thus, the photoinitiator composition or photocurable composition can be applied in a suitable manner to a substrate prior to curing by irradiation. Still again, a photocurable composition can be irradiated during the application to a substrate. Alternatively, the article can be formed with the photocurable composition and irradiated to form a "cured" article.

The photocurable compositions can also be used to form articles with adhesive compositions comprising a photocurable compound mixed with a photoinitiator composition. Similarly, the present invention can include laminated structures (or articles) comprising at least two layers bonded together with an adhesive composition, in which at least one layer is a nonwoven web or film. Accordingly, the present invention can provide a way for laminating a structure having at least two layers with the adhesive composition between the layers by irradiating the adhesive composition to effect curing.

Because the photocuring speeds are high using the present invention, the photocurable composition can be dyed or pigmented into which light penetration is limited. Such dyed or pigmented compositions can be applied to substrates and then irradiated. It is also possible to rapidly and partially or completely cure photocurable compositions while as part of articles.

DEFINITIONS

Unless otherwise indicated, the term "photoinitiator composition" used in this application will refer to embodiments used in the present invention.

The terms "curing", "photocuring", and "polymerizing" are used herein to mean the combining for example, by covalent bonding, of large number of smaller molecules, such as monomers or oligomers, to form very large molecules, that is, macromolecules or polymers, when irradiated with radiation such as ultraviolet (UV), visible, or infrared radiation. The monomers can be combined to form only linear macromolecules or they can be combined to form three-dimensional macromolecule, commonly referred to as crosslinked polymers. Thus, these terms include polymerization of functional oligomers and monomers, or even crosslinkable polymers, into a crosslinked polymer network.

The terms "unsaturated monomer," "functional oligomer," and "crosslinking agent" are used herein with their usual meanings and are well understood by those having ordinary skill in the art.

The singular form of each component of the photoinitiator composition and photocurable composition is intended also to include the plural that is, one or more of the respective components.

The term "ethylenically unsaturated polymerizable material" is meant to include any unsaturated material having one or more carbon-to-carbon double bonds (ethylenically unsaturated groups) capable of undergoing polymerization. The term encompasses ethylenically unsaturated polymerizable monomers, oligomers, and crosslinkable polymers. The singular form of the term is intended to include the plural. Monofunctional monomers, oligomers, and multifunctional acrylates are examples of unsaturated polymerizable compounds.

As used herein, the term "quantum yield" is used herein to indicate the efficiency of a photochemical process. More particularly, quantum yield is a measure of the probability that a particular molecule will absorb a quantum of light during its interaction with a photon. The term expresses the number of photochemical events per photon absorbed. Thus, quantum yields can vary from zero (no absorption) to 1.

The term "photosensitizer" is meant to refer to a light absorbing compound used to enhance the reaction of a photoinitiator. Upon photoexcitation, a photosensitizer leads to energy or electron transfer to a photoinitiator.

The term photoinitiator refers to a compound that generates free radicals. As noted above, photoinitiators can be classified as "Type I" (or photocleavage) photoinitiators and "Type II" (or H-abstraction) photoinitiators according to the pathways by which the effective initiating radicals are generated.

"Actinic radiation" is any electromagnetic radiation that is capable of producing photochemical action and can have a wavelength of at least 150 nm and up to and including 1250 nm, and typically at least 300 nm and up to and including 750 nm.

Photoinitiator Compositions

In their most simple form, the energy-efficient photoinitiator compositions comprise:

(a) at least one radiation-sensitive photoinitiator that absorbs actinic radiation and therefore produces free radicals, (b) at least one organic phosphite, and (c) at least one aldehyde.

Any organic phosphite is useful in the practice of this invention but particularly useful organic phosphites are represented by the following Structure (I):

wherein the multiple R' groups are the same or different substituted or unsubstituted alkyl groups or $HO[\{CH(R)\}_xO]_y$ groups wherein the multiple R groups are the same or different and can be hydrogen atoms or substituted or unsubstituted alkyl groups, or two R' groups can form a substituted or unsubstituted cyclic aliphatic ring or fused ring system, x is a number at least 2 and up to and including 20, and y is at least 1 and up to and including 20.

For example, the multiple R' groups can be the same or different alkyl groups having 1 to 10 carbon atoms or $HO[\{CH(R)\}_xO]_y$ groups wherein the multiple R groups are the same or different and can be hydrogen atoms or substituted or unsubstituted alkyl or cycloalkyl groups, x is an integer of at least 2 and up to and including 10, and y is an integer of at least 1 and up to and including 10.

For example, the photoinitiator composition can comprise one or more of trimethyl phosphite, triethyl phosphite, tripropyl phosphite, tributyl phosphite, triisobutyl phosphite, triamyl phosphite, trihexyl phosphite, trinonyl phosphite, tri-(ethylene glycol) phosphite, tri-(propylene glycol) phosphite, tri(isopropylene glycol) phosphite, tri-(butylene glycol) phosphite, tri-(isobutylene glycol) phosphite, tri-(pentylene glycol) phosphite, tri-(hexylene glycol) phosphite, tri-(nonylene glycol) phosphite, tri-(diethylene glycol) phosphite, tri-(triethylene glycol) phosphite, tri-(polyethylene glycol) phosphite, tri-(polypropylene glycol) phosphite, and tri-(polybutylene glycol) phosphite. Spiro organic phosphites represented by the following Structure (II) are also useful in the present invention.

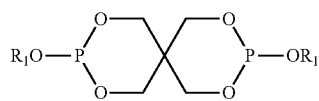 

wherein the two $R_1$ groups are the same or different substituted or unsubstituted alkyl groups or $HO[\{CH(R)\}_xO]_y$ groups wherein the multiple R groups are the same or different and can be hydrogen atoms or substituted or unsubstituted alkyl groups, or the two $R_1$ groups can form a substituted or unsubstituted cyclic aliphatic ring or fused ring system, x is a number at least 2 and up to and including 20, and y is at least 1 and up to and including 20.

In some embodiments, the photoinitiator composition includes two or more different organic phosphites.

Any Type I or Type II photoinitiator that generates radicals either upon direct absorption of actinic radiation or by energy transfer from photosensitizers (described below) is useful in present invention. Such photoinitiators include but are not limited to, aryl ketones, such as α-hydroxy ketones, α-amino ketones, and mono- and bis(acyl)phosphine oxides.

Examples of α-hydroxy and α-amino ketones photoinitiators are disclosed for example in U.S. Pat. No. 4,347,111 (Gehlhaus et al.), U.S. Pat. No. 4,321,118 (Felder et al.), U.S. Pat. No. 4,672,079 (Li Bassi et al.), and U.S. Pat. No. 4,987,159 (Li Bassi et al.), and in WO 04/092287 (Fuchs et al.). Some specific examples are 2-hydroxy-2-methyl-1-phenyl-propanone (Darcur® 1173), 1-hydroxy-cyclohexyl-phenyl-ketone (Irgacure® 184), bis[4-(2-hydroxy-2-methylpropionyl)phenyl]methane (Irgacure® 127), 2-hydroxy-1-{4-[4-(2-hydroxy-2-methyl-propionyl)-phenoxy]-phenyl}-2-methyl-1-propan-1-one, (1-[4-(2-hydroxyethoxy)-phenyl]-2-10 hydroxy-2-methyl-1-propan-1-one) (Irgacure® 2959), and oligo[2-hydroxy 2-methyl-1-[4(1-methyl)phenyl]propanone (Esacure™ KIP 150), which can be obtained from Ciba Specialty Chemicals and Lamberti SpA.

α-Amino ketones, particularly those containing a benzoyl moiety, otherwise called α-amino acetophenones, for example (4-methylthio-benzoyl)-1-methyl-1-morpholinoethane (Irgacure® 907), (4-morpholinobenzoyl)-1-benzyl-1-dimethylaminopropane (Irgacure® 369), (4-morpholinobenzoyl)-1-(4-methylbenzyl)-1-dimethylaminopropane (Irgacure® 379), (4-(2-hydroxyethyl)aminobenzoyl)-1-benzyl-1-dimethylaminopropane), 2-benzyl-2-dimethylamino-1-(3,4-dimethoxyphenyl)butan-1-one, and 4-aroyl-1,3-dioxolanes are also useful.

Other useful photoinitiators include benzoin alkyl ethers and benzil ketals, phenylglyoxalic esters and derivatives thereof such as oxo-phenyl-acetic acid 2-(2-hydroxy-ethoxy)-ethyl ester, and dimeric phenylglyoxalic esters such as oxo-phenyl-acetic acid 1-methyl-2-[2-(2-oxo-2-phenyl-acetoxy)-propoxy]-ethyl ester (Irgacure® 754).

Examples of useful oxime ester photoinitiators are disclosed in U.S. Pat. No. 3,558,309 (Laridon et al.), U.S. Pat. No. 4,255,513 (Laridon et al.), U.S. Pat. No. 6,596,445 (Matsumoto et al.), and U.S. Pat. No. 4,202,697 (DeWinter et al.) and in U.S. Patent Application Publication 2010/0188765 (Matsumoto et al.). Some specific examples are 1,2-octanedione 1-[4-(phenylthio)phenyl]-2-(O-benzoyloxime) (Irgacure® OXE01), ethanone 1-[9-ethyl-6-(2-methylbenzoyl)-9H-carbazol-3-yl]-1-(O-acetyloxime)(Irgacure® OXE02), and 9H-thioxanthene-2-carboxaldehyde 9-oxo-2-(O-acetyloxime).

Per-esters photoinitiators are also useful in present invention. Such compounds include benzophenone tetracarboxylic per-esters as described for example in EP 126,541 (Takeshi et al.).

Examples of useful mono- and bis-acylphosphine oxides are also known from U.S. Pat. No. 4,324,744 (Lechtken et al.), U.S. Pat. No. 4,737,593 (Enrich et al.), and U.S. Pat. No. 6,020,528 (Leppard et al.), and GB Publication 2,259,704 (Koehler et al.). Some specific examples are 2-4-6-(trimethylbenzoyl)diphenyl-phosphine oxide (Dartocur® TPO), bis (2,4,6-trimethylbenzoyl)-phenyl-phosphine oxide (Irgacure® 819), (2,4,6-trimethylbenzoyl)phenyl phosphinic acid ethyl ester (Lucirin TPO-L®BASF), bis(2,4,6-trimethylbenzoyl)-2,4-dipentoxyphenyl-phosphine oxide, and trisacylphosphine oxides.

Useful ketosulfone photoinitiators are known from WO 00/031030 (Meneguzzo et al.). WO 06/120212 (Romagnano et al.) and U.S. Pat. No. 6,048,660 (Leppard et al.), U.S. Pat. No. 4,475,999 (Via), and U.S. Pat. No. 4,038,164 (Via) describe phenylglyoxylates as photoinitiators. Gottschalk et al. have disclosed borates, associated with ionic dyes, as useful as photoinitiators in U.S. Pat. Nos. 4,772,530, 4,772, 541, and 5,151,520. In GB Publication 2,307,474 (Cunningham et al.) have disclosed borates as photoinitiators. Metallocenes such as titanocene-based photoinitiators are in U.S. Pat. No. 5,008,302 (Huesler et al.) and U.S. Pat. No. 5,340, 701 (Desobry).

Mixtures of photoinitiators from a single class of compounds, or from two or more different classes of compounds, can be used if desired. The total amount of photoinitiators in the photoinitiator composition is generally at least 2 weight %, or typically at least 60 weight % and up to and including 90 weight %, based on the total composition solids. The weight ratio of organic phosphite to photoinitiator in the photoinitiator composition is at least 0.5:1 and up to and including 50:1, or typically of at least 1:1 and up to and including 10:1.

The aldehydes useful in the photoinitiator compositions include any compounds having one or more aldehyde (—CHO) moieties. It would be readily apparent to one skilled in the art that the chosen aldehyde should not interfere with curing radiation, with radiation absorption by the photoinitiator, and the basic chemistry of the photoinitiator. Most of the aldehydes are alkyl and aryl aldehydes having one or more aldehyde moieties. For example, useful aldehydes include R''—CHO compounds in which R'' is an alkyl or aryl group that is unsubstituted or substituted with one or more groups that do not adversely affect the behavior of the aldehyde moieties. For example, aryl aldehydes can be substituted or unsubstituted benzaldehydes and naphthaldehydes including but not limited to, 4-methoxybenzaldehyde, 4-methylbenzaldehyde, terephthalaldehyde, 2,5-dimethoxy-1,4-benzenedicarboxaldehyde, and naphthalene-1,4-dicarboxaldehyde. Useful alkyl aldehydes include but are not limited to compounds with substituted or unsubstituted alkyl groups having 1 to 20 carbon atoms in the alkyl group. As used herein, "alkyl group" also include substituted or unsubstituted cycloalkyl groups having 5 to 10 carbon atoms in the ring. Examples of useful alkyl aldehydes include but are not limited to, acetaldehyde, propionaldehyde, butyraldehyde, 2-methylbutyraldehyde, cyclohexanecarboxaldehyde, and cyclopentanecarboxaldehyde.

It is also possible that the "aldehyde" is an oligomeric or polymeric compound having recurring units wherein each unit comprises an aldehyde moiety and is represented for example by —(CH$_2$CH(CHO))—. Thus, in such embodiments, the R'' group noted above is an oligomeric or polymeric backbone and the oligomer or polymer has multiple aldehyde moieties along the backbone.

In one embodiment, the aldehyde has a single aldehyde moiety and a molecular weight less than 300. In other embodiments, the aldehyde has one or two aldehyde moieties and a molecular weight less than 500.

The amount of aldehyde in the photoinitiator composition is chosen in relation to the amount of total organic phosphites. For example, the molar ratio of the organic phosphite to the aldehyde moieties in a composition of this invention is at least 1:1 and up to and including 4:1, or typically at least 1:1 and up to and including 3:1, although more or less phosphite can be used if desired. In some embodiments, the organic phosphite is present in a molar excess (greater than 1:1) compared to the aldehyde moieties in the composition.

An organic phosphite, for example as defined above in Structure (I), and an aldehyde present in the photoinitiator or photocurable composition is believed to react to form an organic phosphite-aldehyde adduct, following the following reaction equation:

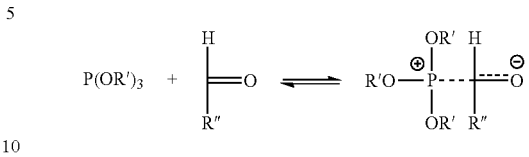

This complexation of phosphite with aldehyde happens rapidly at room temperature [for example, see F. Ramirez, *Pure Appl. Chem.* 1964, 9(2), 337-369] and results in reducing the unpleasant odor associated with many organic phosphites. This is especially true for some commonly available organic alkyl phosphites such as trimethyl phosphite and triethyl phosphite. It is believed that the compositions of this invention can include certain quantities of the organic phosphite-aldehyde adduct as well as unreacted organic phosphite or aldehyde. Unreacted organic phosphites are particularly present when they are included in molar excess relative to the aldehyde moieties in the composition. The organic phosphite-aldehyde adduct, in some cases, can react with another molecule of aldehyde to form tetraalkoxyphosphoranes. In some embodiments, R' is a substituted or unsubstituted alkyl group and R'' is a substituted or unsubstituted phenyl group. This modified composition can also contain non-reacted organic phosphite especially if a molar excess of organic phosphite is present in the original photoinitiator composition. Thus, the modified composition can be prepared by mixing a suitable photoinitiator, an organic phosphite, and an aldehyde at room temperature in a suitable organic solvent. Examples of useful organic solvents include but are not limited to, ethyl methyl ketone, ethyl acetate, chloroform, methylene chloride, acetonitrile, toluene, xylenes, hexane, heptanes, petroleum ether, diethyl ether, and mixtures of two or more of these solvents. The modified composition also can be prepared by mixing a suitable photoinitiator, an organic phosphite, and an aldehyde directly with a photocurable compound, which could also serve as the solvent for the resulting photocurable composition.

In many embodiments, the photoinitiator compositions further comprise a photosensitizer for the photoinitiator. Photosensitizers useful in present invention include any compounds capable of transferring energy from its own lowest excited state after it has absorbed radiation, to the photoinitiator. The driving force for this process depends upon the triplet energy of photosensitizer, $(E^T)_s$, and the triplet energy of photoinitiator, $(E^T)_P$. Thus, for the energy transfer from photosensitizer to photoinitiator to take place the triplet energy of photosensitizer $(E^T)_s$ should to be greater or equal to the triplet energy of photoinitiator, $(E^T)_P$. Even in cases where the triplet energy of the photosensitizer is slightly lower than that of photoinitiator, energy transfer is feasible.

The amount of photosensitizer used in such embodiments of the photoinitiator compositions of this invention depends largely on its optical density at the wavelength(s) of radiation used to initiate curing. Solubility of the photosensitizer in a photocurable composition can also be a factor. It is possible that the photosensitizer is a covalently bound part of a photocurable compound such as an acrylate. Either a photosensitizer bound in this manner or a non-bound photosensitizer with a low extinction coefficient can be utilized at relatively high levels to help facilitate the transfer of an electron to the photoinitiator from a triplet photosensitizer ($^3$S). When covalently attached to a polymeric photocurable compound, the photosensitizer can be present in an amount of at least 0.01 and up to and including 10 weight % based on the total weight of the photoinitiator. An example of such a covalently bound photosensitizer is a benzophenone moiety (that absorbs actinic radiation) that is bound to a photocurable material, or it can be attached to an inert polymeric binder. The amount of the photosensitizers is generally governed by their molar absorptivity or extinction coefficient. Photosensitizers that are not bound to photocurable compounds or polymers can be present in an amount of at least 1 and up to and including 10 weight %, based on the total weight of photoinitiator.

The triplet energies of the photosensitizers useful in present invention are known (for example see *Handbook of Photochemistry*, Eds. Steven L. Murov, Ian Carmichael, Gordon L. Hug, 1993, Marcel Dekker, Inc.). Energies for some photosensitizers or closely related analogs are also disclosed in other literature. Methods to experimentally measure triplet energies are also commonly known in the literature [for example see *J. Amer. Chem. Soc.* 102, 2152 (1980) and *J. Phys. Chem.* 78, 196 (1974)].

Some useful photosensitizers absorb visible light or near ultraviolet light, for example at a wavelength of at least 250 nm and up to and including 450 nm. The ketocoumarins disclosed in *Tetrahedron* 38, 1203 (1982) represent one class of such useful photosensitizers. The ketocoumarins described in U.K. Patent Publication 2,083,832 (Specht et al.) are also useful photosensitizers. The ketocoumarins exhibit very triplet state generation efficiencies. Other classes of useful photosensitizers include but are not limited to, benzophenones, xanthones, thioxanthones, arylketones and polycyclic aromatic hydrocarbons.

The weight ratio of the combination of organic phosphite and aldehyde (including any phosphite-aldehyde adducts) to photoinitiator to photosensitizer in some photoinitiator compositions is at least 0.1:1:0.1 and up to and including 50:1:1, or typically of at least 10:1:0.5 and up to and including 50:2:1. In such embodiments, the molar ratio of the organic phosphite to aldehyde moieties is at least 1:1 and typically at least 2:1.

Photocurable Compositions

The photoinitiator composition is very useful in photocurable compositions to provide polymerized or crosslinked compositions in various forms including but not limited to, coatings on articles, molded articles, printed patterns, fibers, laminates, patternable articles such as photoresists, and bottles.

Such photocurable compositions then comprise at least one photoinitiator (as described above), at least one organic phosphite such as those defined above using Structure (I), at least one aldehyde (as described above), and at least one photocurable compound that can be, for example, an ethylenically unsaturated polymerizable compound (or monomer) that has at least one terminal ethylenically unsaturated group and is capable of forming a polymerized material such as a prepolymer or polymer using photoinitiated addition polymerization. As described above, the photoinitiator is radiation-sensitive and absorbs actinic radiation and produces free radicals.

Such photocurable compounds may be unsaturated monomers and oligomers examples of which include ethylene, propylene, vinyl chloride, isobutylene, styrene, isoprene, acrylonitrile, acrylic acid, methacrylic acid, ethyl acrylate, ethyl methacrylate, methyl acrylate, methyl methacrylate, butyl acrylate, vinyl acrylate, allyl methacrylate, tripropylene glycol diacrylate and other diacrylates and dimethacrylates, various triacrylates and tri-methylacrylates, trimethylol propane ethoxylate acrylate, epoxy acrylates such as the reaction products of a bisphenol A epoxide with acrylic acid, polyether acrylates such as the reaction products of acrylic acid with an adipic acid/hexanediol-based polyether, urethane acrylates such as the reaction product of hydroxypropyl acrylate with diphenylmethane-4,4'-diisocyanate, and polybutadiene diacrylate oligomers.

In many embodiments, the photocurable compound is a mono- or multi-functional acrylate (also intended to include methacrylates) that is considered herein to be any material of any molecular weight that has at least one ethylenically unsaturated group. Such acrylates can be ethylenically unsaturated polymerizable monomers, oligomers, and crosslinkable polymers. The acrylates can have multiple acrylate groups (for example diacrylates and triacrylates). In other embodiments, the photocurable compounds are resins having a weight average molecular weight of at least 100,000.

Many of these embodiments of photocurable compositions can also includes one or more photosensitizers, as described above, that absorb appropriate actinic radiation and are raised to an active state during photocuring.

The photocurable composition can include one or more non-reactive organic solvents including but not limited to, ethyl methyl ketone, ethyl acetate, chloroform, methylene chloride, acetonitrile, toluene, xylenes, hexane, heptanes, petroleum ether, diethyl ether, and mixtures of two or more of these solvents. The photocurable compound itself can act also as the organic solvent and be present as the sole organic solvent or in combination with one or more non-reactive organic solvents. By "non-reactive", I mean that the organic solvent does not react with any of the components of the composition.

In addition, the photocurable composition can include other materials as desired, such as pigments, extenders, amine synergists, and such other additives as are well known to those having ordinary skill in the art. Alternatively, these addenda can be added to the photocurable composition during photocuring.

With both organic phosphite and aldehyde present in the photocurable composition, some of both compounds can react to for the organic phosphite-aldehyde adduct described above but generally it is desired to have a molar excess of organic phosphite so that unreacted organic phosphite is also present in the photocurable composition.

In the photocurable compositions, a photosensitizer for the photoinitiator can be present in an amount of at least 0.1 weight % and up to and including 10 weight %, or at least 0.5 weight % and up to and including 5 weight %, or more typically at least 1 weight % and up to and including 2 weight %, of the photocurable composition.

The photoinitiator concentrations in the photocurable compositions can be specified in terms of weight % of photoinitiator in per gram of photocurable compound (or acrylate). Typical concentrations of photoinitiator are at least 0.1 weight % and up to and including 20 weight %, or typically at least 0.5 weight % and up to and including 10 weight %, or more typically at least 1 weight % and up and including 5 weight % of photocurable composition. The exact amount of photoinitiator that is used, as is commonly understood by one skilled in the art, depends largely on its molar absorptivity at the wavelength of excitation and the efficiency of radical generation.

In addition, the organic phosphite can be present in the photocurable composition in an amount of at least 0.5 weight % and up to and including 20 weight %, typically at least 1 weight % and up to and including 10 weight %, or more typically at least 2 weight % and up to and including 10 weight % of the photocurable composition. The use of larger amounts of organic phosphite is also possible. The relative molar ratio of organic phosphite to aldehyde moieties is generally at least 1:1, and a molar excess of organic phosphite is desirable in many embodiments.

The photoinitiator compositions and photocurable compositions can be provided in any form that is suitable for the various components or intended use. In most embodiments, the photoinitiator compositions and photocurable compositions are in solid form such as powders, granules, or pressed tablets. In some embodiments, the photoinitiator compositions and photocurable compositions are in liquid form, such as solutions containing solvents for solubilizing or dispersing the components. In still other embodiments, the photocurable composition is in liquid form in which the photocurable compound (such as an acrylate) serves as the solubilizing or dispersing solvent.

Photocurable Inks

Some photocurable compositions used in this invention also can be a photocurable ink used to form articles such as photoresists in various imaging operations, which photocurable ink comprises a suitable colorant dissolved or dispersed in a solvent such as an organic solvent or polymerizable monomers or oligomers, a photoinitiator (for example, the compounds and amounts described above), an organic phosphite (such as those defined by Structure (I) above in the amounts described above), and a photocurable compound (such as an acrylate as described above). In some embodiments, the photocurable ink also includes an aldehyde (as described above) and the organic phosphite is present in a molar excess relative to the aldehyde groups in the photocurable ink. For example, the amount of organic phosphite is present in the photocurable ink in an amount of at least 1 and up to and including 20 weight %. The photoinitiator is present in the photocurable ink in an amount as described above for photocurable compositions.

The colorant for use in the photocurable inks can be selected from any suitable soluble dye or pigment dispersion, or a combination thereof. The colorant can be anionic or cationic. The colorant can be present with or without a dispersing agent, which compounds are known in the art.

When dyes are used in the photocurable inks that can be used as ink jetable inks, any suitable commercially available dye can be used to impart the desired color characteristics to the compositions. Either anionic or cationic dyes are useful, but most useful dyes are anionic. Anionic dyes are those in which a negative charge is localized on one atom or spread over the entire molecule. Cationic dyes are those in which a positive charge is localized on one atom or spread over the entire molecule.

Specific examples of useful anionic dyes include Bernacid Red 2BMN, Pontamine Brilliant Bond Blue A, Pontamine, Food Black 2, Carodirect Turquoise FBL Supra Conc. (Direct Blue 199, Carolina Color and Chemical), Special Fast Turquoise 8GL Liquid (Direct Blue 86, Mobay Chemical), Intrabond Liquid Turquoise GLL (Direct Blue 86, Crompton and Knowles), Cibracron Brilliant Red 38-A (Reactive Red 4, Aldrich Chemical), Drimarene Brilliant Red X-2B (Reactive Red 56, Pylam, Inc.), Levafix Brilliant Red E-4B (Mobay Chemical), Levafix Brilliant Red E-6BA (Mobay Chemical), Pylam Certified D&C Red #28 (Acid Red 92, Pylam), Direct Brill Pink B Ground Crude (Crompton & Knowles), Cartasol Yellow GTF Presscake (Sandoz, Inc.), Tartrazine Extra Conc. (FD&C Yellow #5, Acid Yellow 23, Sandoz, Inc.), Carodirect Yellow RL (Direct Yellow 86, Carolina Color and Chemical), Cartasol Yellow GTF Liquid Special 110 (Sandoz, Inc.), D&C Yellow #10 (Acid Yellow 3, Tricon), Yellow Shade 16948 (Tricon), Basacid Black X34 (BASF), Carta Black 2GT (Sandoz, Inc.), Neozapon Red 492 (BASF), Orasol Red G (Ciba-Geigy), Direct Brilliant Pink B (Crompton-Knolls), Aizen Spilon Red C-BH (Hodagaya Chemical Company), Kayanol Red 3BL (Nippon Kayaku Company), Levanol Brilliant Red 3BW (Mobay Chemical Company), Levaderm Lemon Yellow (Mobay Chemical Company), Aizen Spilon Yellow C-GNH (Hodagaya Chemical Company), Spirit Fast Yellow 3G, Sirius Supra Yellow GD 167, Cartasol Brilliant Yellow 4GF (Sandoz), Pergasol Yellow CGP (Ciba-Geigy), Orasol Black RL (Ciba-Geigy), Orasol Black RLP (Ciba-Geigy), Savinyl Black RLS (Sandoz), Dermacarbon 2GT (Sandoz), Pyrazol Black BG (ICI Americas), Morfast Black Conc A (Morton-Thiokol), Diazol Black RN Quad (ICI Americas), Orasol Blue GN (Ciba-Geigy), Savinyl Blue GLS (Sandoz, Inc.), Luxol Blue MBSN (Morton-Thiokol), Sevron Blue 5GMF (ICI Americas), and Basacid Blue 750 (BASF); Levafix Brilliant Yellow E-GA, Levafix Yellow E2RA, Levafix Black EB, Levafix Black E-2G, Levafix Black P-36A, Levafix Black PN-L, Levafix Brilliant Red E6BA, and Levafix Brilliant Blue EFFA, all available from Bayer; Procion Turquoise PA, Procion Turquoise HA, Procion Turquoise Ho5G, Procion Turquoise H-7G, Procion Red MX-5B, Procion Red H8B (Reactive Red 31), Procion Red MX 8B GNS, Procion Red G, Procion Yellow MX-8G, Procion Black H-EXL, Procion Black P-N, Procion Blue MX-R, Procion Blue MX-4GD, Procion Blue MX-G, and Procion Blue MX-2GN, all available from ICI Americas; Cibacron Red F-B, Cibacron Black BG, Lanasol Black B, Lanasol Red 5B, Lanasol Red B, and Lanasol Yellow 46, all available from Ciba-Geigy; Baslien Black P-BR, Baslien Yellow EG, Baslien Brilliant Yellow P-3GN, Baslien Yellow M-6GD, Baslien Brilliant Red P-3B, Baslien Scarlet E-2G, Baslien Red E-B, Baslien Red E-7B, Baslien Red M-5B, Baslien Blue E-R, Baslien Brilliant Blue P-3R, Baslien Black P-BR, Baslien Turquoise Blue P-GR, Baslien Turquoise M-2G, Baslien Turquoise E-G, and Baslien Green E-6B, all available from BASF; Sumifix Turquoise Blue G, Sumifix Turquoise Blue H-GF, Sumifix Black B, Sumifix Black H-BG, Sumifix Yellow 2GC, Sumifix Supra Scarlet 2GF, and Sumifix Brilliant Red 5BF, all available from Sumitomo Chemical Company; Intracron Yellow C-8G, Intracron Red C-8B, Intracron Turquoise Blue GE, Intracron Turquoise HA, and intracron Black RL, all available from Crompton and Knowles, Dyes and Chemicals Division. Mixtures of these colorants also can be used. Dyes that are invisible to the naked eye but detectable when exposed to radiation outside the visible wavelength range (such as ultraviolet or infrared radiation), such as dansyl-lysine, N-(2-amino-ethyl)-4-amino-3,6-disulfo-1,8-dinaphthalimide dipotassium salt, N-(2-aminopentyl)-4-amino-3,6-disulfo-1,8-dinaphthalimide dipotassium salt, Cascade Blue ethylenediamine trisodium salt (available from Molecular Proes, Inc.), Cascade Blue cadaverine trisodium salt (available from Molecular Proes, Inc.), bisdiazinyl derivatives of 4,4'-diaminostilbene-2,2'-disulfonic acid, amide derivatives of 4,4'-diamino-stilbene-2,2'-disulfonic acid, phenylurea derivatives of 4,4'-disubstituted stilbene-2, 2'-disulfonic acid, mono- or di-naphthyltriazole derivatives of 4,4'-disubstituted stilbene disulfonic acid, derivatives of benzothiazole, derivatives of benzoxazole, derivatives of benzimidazole, derivatives of coumarin, derivatives of pyrazolines containing sulfonic acid groups, 4,4'-bis(triazin-2-ylamino)stilbene-2,2'-disulfonic acids, 2-(stilben-4-yl) naphthotriazoles, 2-(4-phenylstilben-4-yl)benzoxazoles, 4,4-bis(triazo-2-yl)stilbene-2,2'-disulfonic acids, 1,4-bis (styryl)-biphenyls, 1,3-diphenyl-2-pyrazolines, bis(benzazol-2-yl) derivatives, 3-phenyl-7-(triazin-2-yl)coumarins, carbostyrils, naphthalimides, 3,7-diamino-dibenzothiophen-2,8-disulfonic acid-5,5-dioxide, other commercially available materials, such as C.I. Fluorescent Brightener No. 28

(C.I. 40622), and the fluorescent series Leucophor B-302, BMB (C.I. 290), BCR, and BS (available from Leucophor) are also useful.

Examples of additional suitable dyes include, but are not limited to, anthraquinones, monoazo dyes, diazo dyes, phthalocyanines, aza[18]annulenes, formazan copper complexes, Bernacid Red (Berncolors, Poughkeepsie, N.Y.), Pontamine Brilliant Bond Blue, Berncolor A. Y. 34, Telon Fast Yellow 4GL-175, Basacid Black SE 0228 (BASF), the Pro-Jet series of dyes available from ICI, including Pro-Jet Yellow I (Direct Yellow 86), Pro-Jet Magenta I (Acid Red 249), Pro-Jet Cyan I (Direct Blue 199), Pro-Jet Black I (Direct Black 168), and Pro-Jet Yellow 1-G (Direct Yellow 132), Pro-Jet Fast Yellow, Cyan and Magenta (Zeneca Inc.), Aminyl Brilliant Red F-B (Sumitomo Chemical Co.), the Duasyn line of "salt-free" dyes available from Hoechst, such as Duasyn Direct Black HEF-SF (Direct Black 168), Duasyn Black RL-SF (Reactive Black 31), Duasyn Direct Yellow 6G-SF VP216 (Direct Yellow 157), Duasyn Brilliant Yellow GL-SF VP220 (Reactive Yellow 37), Duasyn Acid Yellow XX-SF VP413 (Acid Yellow 23), Duasyn Brilliant Red F3B-SF VP218 (Reactive Red 180), Duasyn Rhodamine B-SF VP353 (Acid Red 52), Duasyn Direct Turquoise Blue FRL-SF VP368 (Direct Blue 199), and Duasyn Acid Blue AE-SF VP344 (Acid Blue 9), and mixtures thereof.

Examples of cationic dyes include the following from Crompton & Knowles Corp: Sevron Yellow L200 200%, Sevron Brilliant Red 4G 200%, Sevron Brilliant Red B 200%, Sevron Blue 2G, Sevron Black B1, Basic Black PSr, and Basic Black RX. Other cationic dyes can also be used in photocurable inks.

In addition, the colorant for the photocurable inks can be a pigment, or a mixture of one or more dyes, or one or more dyes and one or more pigments. The pigment can be black, cyan, magenta, yellow, red, blue, green, or brown pigments or mixtures thereof. Examples of suitable black pigments include various carbon blacks such as channel black, furnace black, and lamp black, such as Levanyl Black A-SF (Miles, Bayer) CAB-O-JET 200.™ and CAB-O-JET 300.™ (Cabot) and Sunsperse Carbon Black LHD 9303 (Sun Chemicals). Colored pigments include red, green, blue, brown, magenta, cyan, and yellow particles, as well as mixtures thereof. Illustrative examples of magenta pigments include 2,9-dimethyl-substituted quinacridone and anthraquinone, identified in the Color Index as CI 60710, CI Dispersed Red 15, and CI Solvent Red 19. Illustrative examples of suitable cyan pigments include copper tetra-4-(octadecyl sulfonamido) phthalocyanine, X-copper phthalocyanine pigment, listed in the Color Index as CI 74160, CI Pigment Blue, and Anthradanthrene Blue, identified in the Color Index as CI 69810, and Special Blue X-2137. Illustrative examples of yellow pigments include diarylide yellow 3,3-dichlorobenzidene acetoacetanilides, a monoazo pigment identified in the Color Index as CI 12700, CI Solvent Yellow 16, a nitrophenyl amine sulfonamide identified in the Color Index as Foron Yellow SE/GLN, CI Dispersed Yellow 33, 2,5-dimethoxy-4-sulfonanilide phenylazo-4'-chloro-2,5-dimethoxy acetoacetanilide, and Permanent Yellow FGL. Additional examples of pigments include Normandy Magenta RD-2400 (Paul Uhlich), Sunsperse Quindo Magenta QHD 6040 (Sun Chemicals), Paliogen Violet 5100 (BASF), Paliogen Violet 5890 (BASF), Permanent Violet VT2645 (Paul Uhlich), Heliogen Green L8730 (BASF), Argyle Green XP-111-S (Paul Uhlich), Brilliant Green Toner GR 0991 (Paul Uhlich), Heliogen Blue L6900 and L7020 (BASF), Heliogen Blue D6840 and D7080 (BASF), Sudan Blue OS (BASF), PV Fast Blue B2G01 (American Hoechst), Sunsperse Blue BHD 6000 (Sun Chemicals), Irgalite Blue BCA (Ciba-Geigy), Paliogen Blue 6470 (BASF), Sudan III (Matheson, Coleman, Bell), Sudan II (Matheson, Coleman, Bell), Sudan IV (Matheson, Coleman, Bell), Sudan Orange G (Aldrich), Sudan Orange 220 (BASF), Paliogen Orange 3040 (BASF), Ortho Orange OR 2673 (Paul Uhlich), Paliogen Yellow 152, 1560 (BASF), Lithol Fast Yellow 0991K (BASF), Paliotol Yellow 1840 (BASF), Novoperm Yellow FG 1 (Hoechst), Permanent Yellow YE 0305 (Paul Uhlich), Lumogen Yellow D0790 (BASF), Sunsperse Yellow YHD 6001 (Sun Chemicals), Suco-Gelb L1250 (BASF), Suco-Yellow D1355 (BASF), Hostaperm Pink E (American Hoechst), Fanal Pink D4830 (BASF), Cinquasia Magenta (DuPont), Lithol Scarlet D3700 (BASF), Tolidine Red (Aldrich), Scarlet for Thermoplast NSD PS PA (Ugine Kuhlmann of Canada), E. D. Toluidine Red (Aldrich), Lithol Rubine Toner (Paul Uhlich), Lithol Scarlet 4440 (BASF), Bon Red C (Dominion Color Company), Royal Brilliant Red RD-8192 (Paul Uhlich), Oracet Pink RF (Ciba-Geigy), Paliogen Red 3871K (BASF), Paliogen Red 3340 (BASF), and Lithol Fast Scarlet L4300 (BASF).

Additional suitable commercially available pigment dispersions include: Hostafine™ pigments available from Celanese Corporation, including Hostafine Black T, Hostafine Black TS, Hostafine Yellow HR, Hostafine Yellow GR, Hostafine Red FRLL, Hostafine™ Rubine F6B, and Hostafine™ Blue B2G; pigment dispersions available from Bayer AG including Levanyl™ Yellow 5GXZ-SF; pigment dispersions available from Degussa Company including Derussol™ carbon black pigment dispersions comprising Derussol™ Z350S, Derussol™ VU 25/L, Derussol™ 345, and Derussol (D 3450S; pigment dispersions available from BASF Corporation, including Disperse Black 006607, Luconyl™ Yellow 1250, Basoflex Pink 4810, and Luconyl™ Blue 7050; and pigment dispersions available from Sun Chemical Corporation including, Sunsperse™ Red RHD 9365 and Sunsperse™ Magenta W83012.

It is generally desired that pigment colorants used in the photocurable inks have a particle size as small as possible to enable a stable dispersion of the particles in the liquid vehicle and to prevent clogging of the ink channels or nozzle when the ink is used in an ink jet printer. For example, the particle average diameters are generally at least 0.001 and up to and including 0.3 μm, although particle sizes outside this range can be used. Generally, at least 70% of the pigment particles should have an average diameter of less than about 0.1 μm for carbon blacks and 0.3 μm for color pigments.

When dyes are used as colorants, the dyes are present in the photocurable ink in any effective amount and combinations needed to provide a desired color. For example, one or more dyes are present in an amount of at least 1 and up to and including 15% by weight of the photocurable ink, and typically at least 2 and up to and including 8% by weight (wherein the amount refers to an amount of dye molecules present in the photocurable ink), although the amounts can be outside these ranges. A mixture of dyes in the proportions desired to obtain a specific shade can also be used.

Similarly, when pigments are used, the pigments can be present in the photocurable inks in any effective amount. Generally, one or more pigments are present in an amount of at least 1% and up to and including 10% by weight of the photocurable ink composition solids, and typically at least 2% and up to and including 8% by weight, although the amounts can be outside of these ranges. When both dyes and pigments are incorporated into the photocurable inks, the weight percentage of the combined colorants can be adjusted accordingly.

Pigments can be dispersed in the photocurable inks using one or more dispersants that can be anionic, cationic, or nonionic. Ionic dispersants have both ionic (capable of ionization in water) and hydrophobic (affinity for pigments) moieties. Suitable nonionic dispersants include, but are not limited to, ethoxylated monoalkyl or dialkyl phenols including Igepal™ CA and CO series materials (Rhone-Poulenc Co.), Triton™ series materials (Union Carbide Company), and Fluorad FC430 (ex 3M Corp.) materials. Such surfactants (when present) can be present in an amount of at least 0.1% and up to and including 10% by weight of the total photocurable ink.

The weight ratio of pigment to pigment dispersant(s) in the photocurable ink can be at least 1:0.01 and up to and including 1:3, or typically at least 1:0.1 and up to and including 1:1. The photocurable ink should contain enough dispersant to stabilize the pigment particle dispersion, but not so much as to adversely affect properties of the photocurable ink viscosity, stability, and optical density.

In some embodiments, the photocurable inks are substantially free or totally free of organic solvents, meaning that they less than 10%, or less than 5% of organic solvent(s) based on the total weight of the photocurable ink.

The photocurable inks can also contain certain photocurable resins present that have a small enough particle size so as not to result in clogging of ink jet heads or nozzles. A smaller particle size is desired since this will reduce the chance of forming aggregates that could potentially plug the ink jet printing head or nozzle. Typical photocurable resins used in the photocurable inks have a mean particle size at least 30 and up to and including 80 nm. While photocurable resin with a mean particle size of about 70 to about 80 nanometers, or typically a mean particle size of at least 30 and up to and including 50 nm particularly if an ink cartridge is to be refilled and reused. Examples of suitable photocurable resins include, but are not limited to, urethane resins, acrylic resins, polyester resins, epoxy acrylate resins, and mixtures thereof, wherein the photocurable resins contain a sufficient level of unsaturation for example carbon-carbon double bonds groups to enable the resin to photopolymerize at a rate practical for the desired printing speed. The resins can be from any backbone, but an aliphatic backbone is currently preferred for uses where the final printed article must have the optimum durability. Typically, the unsaturation is obtained from acrylate or methacrylate functionality such as acrylate based monomers including polyfunctional alkoxylated acrylate monomers such as di- or tri-acrylates. However, alkoxylated or polyalkoxylated acrylic monomers of higher functionality can also be used alone or together with one or more di- or trifunctional materials. It is desired that the total amount of the polyfunctional material (alkoxylated+polyalkoxylated) is in the range at least 80% and up to and including 95% by weight of the photocurable ink. The number of alkoxy groups can be from 1 to 20 per molecule of the monomer. The alkyleneoxy group can be a $C_2$-$C_4$ alkyleneoxy, such as ethoxy (EO) or propoxy (PO) groups. Suitable polyfunctional alkoxylated or polyalkoxylated acrylates can be selected from alkoxylated such as ethoxylated or propoxylated, variants of the following: neopentyl glycol diacrylates, butanediol diacrylates, trimethylpropane tri-acrylates and glyceryl triacrylate.

Optionally, photocurable inks can also contain some monofunctional alkoxylated or polyalkoxylated acrylated monomer material, for example up to 10% by weight of the total photocurable ink for example selected from one or more of alkoxylated (ethoxylated or propoxylated) variants of the following: tetrahydrofurfuryl acrylates, cyclohexyl acrylates, alkyl acrylates, nonyl-phenol acrylate and polyethylene or polypropylene glycol acrylates. The photocurable inks can also comprise minor amounts of non-alkoxylated radiation curable monomer material, either monofunctional or polyfunctional, such as up to no more than 5% by weight of the photocurable ink, for example selected from one or more of octyl acrylate, decyl acrylate, N-vinylpyrolidone, ethyl diglycol acrylate, isobornyl acrylate, ethyl-hexyl acrylate, lauryl acrylate, butanediol monoacrylate, β-carboxyethyl acrylate, isobutyl acrylate, polypropylene glycol monomethacrylate, 2-hydroxyethyl methacrylate, difunctional (meth)acrylic acid esters, for example hexanediol di-(meth)acrylate, tetraethylene glycol diacrylate, tripropylene glycol diacrylate, butanediol diacrylate, polyethylene glycol diacrylates and triethylene glycol dimethacrylate.

Photocurable inks optionally comprise one or more minor ingredients, for example, surfactants, leveling additives, stabilizers, wetting agents, and pigment stabilizers that are known in the art. Pigment stabilizers can be for example polyester, polyurethane, or polyacrylate types, especially in the form of high molecular weight block co-polymers, and would typically be incorporated in an amount of at least 2.5% and up to and including 100% by weight of the pigment. Suitable examples are Disperbyk 161 or 162 (ex BYK Chemie) or Solsperse ex Zeneca.

The amounts of the polymerizable monomer(s), photoinitiator, organic phosphite, colorant (and optional aldehyde) in the photocurable inks can vary according to the particular equipment and application.

The photocurable inks can also include one or more photosensitizers as described above, for example wherein the weight ratio of the photoinitiator to the photosensitizer is at least 1:1 and up to and including 100:1. Other details of the photocurable inks would be readily apparent to a skilled worker using the teaching provided in this disclosure.

These photocurable inks can be used in various methods. For example, a method of applying an ink comprises:

providing the photocurable ink described herein (either with or without the presence of an aldehyde), curing the photocurable ink by irradiating it with curing radiation, and before or during curing, applying the photocurable ink to a substrate.

In some embodiments, the photocurable ink is only partially cured with the curing radiation before application to the substrate. This procedure can be used to modify the viscosity of the photocurable ink. In other embodiments, the photocurable ink is applied to the substrate before any curing. It is particularly advantageous that these methods can be carried out in the presence of oxygen.

Methods of Photocuring and Uses Thereof

The present invention is also directed to a method of generating free radicals to affect photocuring, especially in oxygen-containing environments. The method of generating free radicals involves generating a free radical by exposing the described photoinitiator compositions to suitable actinic radiation. The exposure of the photoinitiator compositions to a radiation source triggers a photochemical process. As stated above, the term "quantum yield" is used herein to indicate the efficiency of a photochemical process. This photocuring can be carried out before the composition is incorporated into an article, or more likely, it is incorporated into an article before photocuring.

The photoinitiator composition absorbs photons of specific wavelength(s) and transfers the absorbed energy to one or more excitable portions of the composition. The excitable portion of the compositions absorbs enough energy to cause a bond breakage that generates one or more free radicals. The efficiency with which radicals are generated with the photoinitiators depends on quantum yield of the given photoinitiator. Thus, the photoinitiators can be employed in any situation where radicals are required, such as described above for photocuring or photopolymerization in articles of this invention.

By way of illustration only, a photocurable composition (as described above) is prepared or provided and irradiated, for example, in the presence of oxygen, to cause photocuring or polymerization of various photocurable compounds within the composition and used for coatings, printed or patterned articles, photoresists, or providing any image in an article of any size or shape.

The photocurable composition can be used to polymerize or cure a photocurable compound by exposure to suitable radiation for a time and energy sufficient for efficacious photocuring. The photocurable compound can be mixed with the photoinitiator compositions using any suitable mixing means known in the art, following which the mixture is irradiated with an amount of radiation. The amount of radiation sufficient to polymerize the compound is readily determinable by one of ordinary skill in the art, and depends upon the identity and amount of photoinitiator composition, the identity and amount of the photocurable compound, the intensity and wavelength of the radiation, and the duration of exposure to the radiation. In some instances, photocuring can occur during the mixing, or both during and after the mixing. For example, some photocurable compositions can be partially cured, treated in some manner, and then subjected to further curing.

The photoinitiating compositions can be used to prepare photocurable compositions by simply mixing, under "safe light" conditions, the photoinitiating composition, or individually, the photoinitiator, an optional photosensitizer for the photoinitiator, an aldehyde, and an organic phosphite compound, with a suitable photocurable acrylate or other photocurable compound. This mixing can occur in suitable inert solvents if desired. Examples of suitable solvents include but are not limited to, acetone, methylene chloride, and any solvent that does not react appreciably with the phosphite, photoinitiator, aldehyde, photocurable compound, or photosensitizer.

A liquid organic material to be polymerized or photocured (such as an acrylate) can be used as the solvent for mixing, or it can be used in combination with another liquid. An inert solvent can be used also to aid in obtaining a solution of the materials and to provide suitable viscosity to the photocurable compositions for coatings, or other materials or operations. However, solvent-free photocurable compositions also can be prepared by simply dissolving the photoinitiator, the organic phosphite, aldehyde, or photosensitizer in the organic photocurable material with or without mild heating.

The present invention can be used to produce a film by forming the photocurable composition into a film and irradiating the film with an amount of radiation sufficient to polymerize or cure the composition. Any film thickness can be produced as long as the photocurable composition sufficiently polymerizes upon exposure to radiation. This film can form an article for various purposes. The photocurable composition can be drawn into a film on a nonwoven web or on a fiber, thereby providing a cured coating on a nonwoven web or fiber. Any method known in the art for drawing the photocurable composition into a film can be used. The amount of radiation sufficient to photocure the photocurable composition is readily determinable by one of ordinary skill in the art, and depends upon the identity and amount of photoinitiator, the identity and amount of the photocurable compound, the thickness of the admixture, the intensity and wavelength of the radiation, and the duration of exposure to the radiation.

The present invention can also be used to provide adhesive compositions comprising at least one unsaturated polymerizable or photocurable compounds admixed with photoinitiator composition. Similarly, the present invention can provide a laminated structure (or article) comprising at least two layers bonded together with the described adhesive composition. In one embodiment, a laminate is produced wherein at least one layer is a cellulosic or polyolefin nonwoven web or film. Accordingly, the present invention can be used to provide a method of laminating a structure wherein a structure having at least two layers with the described adhesive composition between the layers is irradiated to polymerize or photocure the adhesive composition. It is to be understood that any substrate can be used in the laminates as long as at least one of the substrates allows sufficient radiation to penetrate through the layer to enable the admixture to polymerize to the desired extent. For example, such a layer can be transparent. Accordingly, any cellulosic or polyolefin nonwoven web or film known in the art may be used as one of the layers so long as they allow radiation to pass through. As described above, the amount of radiation sufficient to photocure the adhesive composition would be readily determinable by one of ordinary skill in the art, and depends upon the identity and amount of photoinitiator, the identity and amount of the photocurable compound, the thickness of the adhesive composition, the identity and thickness of the layer, the intensity and wavelength of the radiation, and the duration of exposure to the radiation.

Thus, the present invention can be used to prepare an article that is obtained from a photocurable coating comprising a photocurable composition that comprises at least one photoinitiator, at least one organic phosphite, at least one aldehyde, and at least one photocurable compound. This photocurable coating can be disposed on a suitable substrate that is a coated or uncoated paper, metal, coated or uncoated polymeric film, ceramic, glass, or fabrics. For example, the photocurable composition can be disposed onto a substrate as a varnish coating that is this irradiated in a suitable manner. The photocurable coating can also be cured in an imagewise pattern or uniformly.

The photocurable coating can be disposed on the substrate uniformly or in a pattern. For example, the photocurable coating can be disposed on, or alternatively applied to, the substrate in an imagewise pattern using an imagewise patterning or imaging method including the use of a mask. Such articles include but are not limited to, printed circuit board precursors in which a photocured image or pattern to provide a printed circuit board. In some embodiments used to provide articles of this invention, the photocurable composition includes the organic phosphite in a molar excess to the aldehyde groups in the composition.

Other articles can be formed from a photocurable composition as a coating, component, or pattern. Thus, a photocurable composition is provided in the article, and the photocurable composition is suitably irradiated to cure it, partially or uniformly. This article can include a substrate on which the photocurable composition is disposed, or the article can include the photocurable composition as the substrate itself. The irradiation of the article, or to form the article, is particularly advantageous if carried out in the presence of oxygen.

Other articles of this invention are composed of already cured photocurable compositions. Thus, a precursor articles can be formed with a photocurable composition, and this precursor article is irradiated in a suitable manner to form an article of this invention. For example, a precursor article of this invention is a photoresist precursor that includes a uniform coating or a pattern of the photocurable composition. This photoresist precursor is then irradiated in a suitable manner to (through a mask if a uniform coating is used) to provide a photoresist with a desired pattern.

As noted above, the photoinitiator composition can be used in a method of photocuring a photocurable composition to form an article, comprising:

mixing at least one photoinitiator, at least one organic phosphite, at least one aldehyde, and at least one photocurable compound to form a photocurable composition, and irradiating the photocurable composition to provide a photocured composition. The irradiating step is advantageously carried out in the presence of oxygen. The photocurable composition can be coated onto a substrate (film, fiber, or molded article) prior to irradiation, or during irradiation.

In some methods, the photocurable composition is partially cured during the irradiating step to provide a partially cured composition. For example, the photocurable composition can be jetted out of a nozzle (such as a photocurable ink) onto a substrate before partial curing from the irradiating step to modify the viscosity of the photocurable composition. This process can also comprise a step of further curing the partially cured photocurable composition on the substrate to form a desired article.

The irradiating step is carried out using radiation having a wavelength of at least 100 nm and up to and including 1250 nm, and particularly at a wavelength of at least 100 nm and up to and including 1,000 nm. The photocuring radiation may be ultraviolet radiation, including near ultraviolet and far or vacuum ultraviolet radiation, visible radiation, and near infrared radiation. Desirably, the radiation will have a wavelength of at least 100 nm and up to and including 900 nm, or typically at least 100 nm and up to and including 700 nm. Useful ultraviolet radiation has a wavelength of from at least 100 nm and up to and including 400 nm. The radiation desirably will be incoherent, pulsed ultraviolet radiation from a dielectric barrier discharge excimer lamp or radiation from a mercury lamp. Other sources of radiation can be used.

In many embodiments, the photocurable composition is dissolved or dispersed in a solvent before the irradiating step. Alternatively, the photocurable composition is mixed as a solution with at least one photocurable compound acting as the solvent. In either of these embodiments, the photocurable compound can be a photocurable acrylate.

Thus, the method can further comprise applying the photocurable composition to a substrate before the irradiating step. Alternatively, the method includes putting the photocurable composition into a mold before the irradiating step.

In these methods, the photocurable composition comprises the photoinitiator (described above) in an amount of at least $6 \times 10^{-7}$ and up to and including $6 \times 10^{-2}$ moles per gram of one or more photocurable compounds (described above, such as acrylates). Moreover, the photocurable composition can further include a photosensitizer (described above) that is present in an amount of at least $5 \times 10^{-7}$ and up to and including $1 \times 10^{-4}$ moles per gram of the one or more photocurable compounds. The photocurable composition used in this method can comprise the organic phosphite (described above) in the amounts described above. The one or more photocurable compounds can include a photocurable monomeric, oligomeric, or polymeric acrylate. In some embodiments, the one or more photocurable compounds comprise a photocurable acrylate that comprises a photosensitizer for the photoinitiator.

Where an aldehyde is present in the photocurable composition, the organic phosphite can be present in a molar excess relative to the aldehyde moieties, or a molar ratio of at least 1:1 and up to and including 4:1. For example, the aldehyde can be an alkyl or aryl aldehyde having one or more aldehyde moieties and having a molecular weight less than 500.

The photoinitiator composition can be used in a method of imaging comprising:

A) providing a photocurable composition comprising at least one photoinitiator (described above), at least one organic phosphite (described above), at least one aldehyde (described above), and at least one photocurable compound (described above, such as an acrylate) to form a photocurable composition, and B) imagewise irradiating the photocurable composition to affect a cured image.

The photocurable composition can be applied to a substrate prior to the imagewise irradiating step. Moreover, the imagewise irradiating step can be carried out by irradiating the photocurable composition through a mask image.

The photocurable composition can be applied to a substrate (described above) during the imagewise irradiating step. For example, the photocurable composition can be applied to a metal substrate for use in providing a printed circuit board or photoresist. If desired, the photocurable composition further comprises a photosensitizer (described above) for the photoinitiator. Moreover, imagewise irradiating the photocurable composition can be carried out in a pattern and the non-cured portions of the photocurable composition can be removed by development. Useful developers would be readily apparent to a skilled worker and dependent upon the photocurable compound that is used. It is particularly advantageous to carry out imagewise irradiating in the presence of oxygen.

Evaluation of useful photoinitiator compositions as initiating systems for photopolymerization or photocuring can be carried out using an acrylate-based coating formulation (see Examples below). Irradiation to initiate photocuring can be carried out using a filtered mercury lamp output with or without band-pass filters. This is just one source of useful radiation. The efficiency of photopolymerization can be determined by the amount of photocured polymer retained after solvent development, which leaves behind only the areas that had sufficient exposure to cause crosslinking of the photocurable acrylates. Thus, a more efficient photoinitiator composition can create more crosslinked polymer than a less efficient photoinitiator composition.

The present invention provides at least the following embodiments and combinations thereof, but other combinations of features are considered to be within the present invention as a skilled artisan would appreciate from the teaching of this disclosure:

1. An article comprising a photocurable composition that comprises at least one photoinitiator, at least one organic phosphite, at least one aldehyde, and at least one photocurable compound.

2. The article of embodiment 1 further comprising a substrate on which the photocurable composition is disposed as a varnish coating.

3. The article of embodiment 2 wherein the photocurable composition is disposed on the substrate in a pattern.

4. The article of embodiment 2 or 3 wherein the photocurable composition is disposed on the substrate in an imagewise pattern.

5. The article of embodiment 2 or 3 wherein the photocurable composition is disposed on the substrate uniformly.

6. The article of any of embodiments 1 to 5 that is a printed circuit board precursor.

7. The article of any of embodiments 1 to 6 wherein the organic phosphite is represented by the Structure (I) or (II):

wherein the multiple R' groups are the same or different substituted or unsubstituted alkyl groups or HO[{CH(R)}$_x$O]$_y$ groups wherein the multiple R groups are the same or different and can be hydrogen atoms or substituted or unsubstituted alkyl groups, or two R' groups can form a cyclic aliphatic ring or fused ring system,

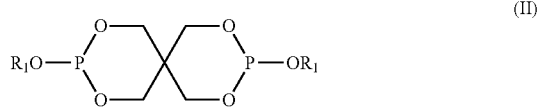

wherein the two $R_1$ groups are the same or different substituted or unsubstituted alkyl groups or HO[{CH(R)}$_x$O]$_y$ groups wherein the multiple R groups are the same or different and can be hydrogen atoms or substituted or unsubstituted alkyl groups, or the two $R_1$ groups can form a substituted or unsubstituted cyclic aliphatic ring or fused ring system, and x is a number at least 2 and up to and including 20, and y is at least 1 and up to and including 20.

8. The article of embodiment 7 wherein the multiple R' groups are the same or different alkyl groups having 1 to 10 carbon atoms or HO[{CH(R)}$_x$O]$_y$ groups wherein the multiple R groups are hydrogen atoms, x is an integer of at least 2 and up to and including 10, and y is an integer of at least 1 and up to and including 10.

9. The article of any of embodiments 1 to 8 comprising one or more of trimethyl phosphite, triethyl phosphite, tripropyl phosphite, tributyl phosphite, triisobutyl phosphite, triamyl phosphite, trihexyl phosphite, trinonyl phosphite, tri-(ethylene glycol) phosphite, tri-(propylene glycol) phosphite, tri(isopropylene glycol) phosphite, tri-(butylene glycol) phosphite, tri-(isobutylene glycol) phosphite, tri-(pentylene glycol) phosphite, tri-(hexylene glycol) phosphite, tri-(nonylene glycol) phosphite, tri-(diethylene glycol) phosphite, tri-(triethylene glycol) phosphite, tri-(polyethylene glycol) phosphite, tri-(polypropylene glycol) phosphite, and tri-(polybutylene glycol) phosphite.

10. The article of any of embodiments 1 to 9 wherein the photoinitiator is one or more of a benzoin, aryl ketone, α-amino ketone, mono- or bis(acyl)phosphine oxide, benzoin alkyl ether, benzil ketal, phenylglyoxalic ester or derivatives thereof, oxime ester, per-ester, ketosulfone, phenylglyoxylate, borate, and a metallocene.

11. The article of any of embodiments 1 to 10 wherein the aldehyde is an alkyl or aryl aldehyde having one or more aldehyde moieties.

12. The article of any of embodiments 1 to 11 wherein the photocurable composition further comprises a photosensitizer for the photoinitiator that is selected from the group consisting of ketocoumarins, benzophenones, xanthones, thioxanthones, arylketones, and polycyclic aromatic hydrocarbons.

13. The article of any of embodiments 1 to 12 wherein the molar ratio of the organic phosphite to the aldehyde moieties in the photocurable composition is at least 1:1 and up to and including 4:1.

14. The article of any of embodiments 1 to 13 wherein the total amount of photoinitiators in the photocurable composition is generally at least 2 weight % and up to and including 80 weight %, based on the total weight of photoinitiator and organic phosphite, and the molar ratio of organic phosphite to photoinitiator is at least 0.5:1 and up to and including 50:1.

15. The article of any of embodiments 1 to 14 wherein the organic phosphite is present in the photocurable composition in a molar excess to the aldehyde moieties.

16. An article having a photocured composition, which article is obtained by irradiating the photocurable composition in the article of any of embodiments 1 to 15.

17. The article of embodiment 16 that is a printed circuit board having a photocured image.

18. An article having a composition comprising a photocurable composition that comprises at least one photoinitiator, a reaction product of an organic phosphite and an aldehyde, and at least one photocurable compound.

19. The article of embodiment 18 wherein the composition further comprises a photosensitizer for the photoinitiator, the aldehyde is an alkyl or aryl aldehyde having one or more aldehyde moieties, and the organic phosphite is represented by the Structure (I) or (II):

wherein the multiple R' groups are the same or different substituted or unsubstituted alkyl groups or HO[{CH(R)}$_x$O]$_y$ groups wherein the multiple R groups are the same or different and can be hydrogen atoms or substituted or unsubstituted alkyl groups, or two R' groups can form a cyclic aliphatic ring or fused ring system,

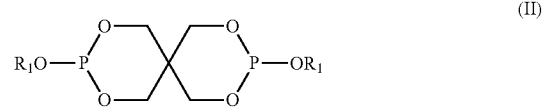

wherein the two $R_1$ groups are the same or different substituted or unsubstituted alkyl groups or HO[{CH(R)}$_x$O]$_y$ groups wherein the multiple R groups are the same or different and can be hydrogen atoms or substituted or unsubstituted alkyl groups, or the two $R_1$ groups can form a substituted or unsubstituted cyclic aliphatic ring or fused ring system, and x is a number at least 2 and up to and including 20, and y is at least 1 and up to and including 20.

20. A method of providing the article of any of embodiments 16 to 19 comprising:

providing an article comprising a photocurable composition that comprises at least one photoinitiator, at least one organic phosphite, at least one aldehyde, and at least one photocurable compound, and irradiating the photocurable composition.

21. The method of embodiment 20 wherein the article has a substrate upon which the photocurable composition is disposed.

22. The method of embodiment 21 wherein the article has a metal, polymer, or ceramic substrate and the irradiating is carried out in a uniform manner.

23. The method of any embodiments 20 to 22 in which the irradiating is carried out in the presence of oxygen.

The present invention is further described by the examples which follow. Such examples, however, are not to be construed as limiting in any way either the spirit or the scope of the present invention. In the examples, all parts are by weight, unless stated otherwise.

The unexpected curing speed produced by the photoinitiating compositions of the present invention is best understood by comparing their performance, when used with phosphite, to their performance when used without one. A series of photocurable polymerizable mixtures containing invention photoinitiating compositions were formulated and compared with photocurable mixtures containing only the photoinitiator.

In all of the results shown below, the term "efficiency gain" refers to the increased "speed" of curing that is represented by the ratio of curing energy dose of the comparative composition to the inventive composition. In addition, the term "curing degree" can be evaluated by the extent of tackiness of the "cured" composition.

COMPARATIVE EXAMPLE 1

A non-inventive photocurable mixture was prepared by dissolving Irgacure® 651 (1 weight %, 130 mg) in ethoxylated (20) trimethylolpropane triacrylate (13 g, SR 415 from Sartomer). This photopolymerizable composition was then coated onto a glass plate and exposed in air to output from Hg light source. The cure efficiency was measured in terms of total dose required to attain crosslinking and the results are summarized in TABLE I below.

COMPARATIVE EXAMPLE 2

Another non-inventive photocurable composition was prepared by dissolving triethyl phosphite (5 weight %, 0.650 g) and Irgacure® 651 (1 weight %, 130 mg) in ethoxylated (20) trimethylolpropane triacrylate (13 g, SR 415 from Sartomer). This photocurable mixture was then coated onto a glass plate and exposed to light from output of an Hg light source in air. The cure efficiency was measured in terms of total dose required to attain complete crosslinking and the results are summarized in TABLE I below.

TABLE I

| Photocuring Efficiency in Air | | | |
|---|---|---|---|
| | Dose mJ/cm² | Efficiency Gain | Curing Degree |
| Comparative Example 1 (no phosphite) | 15 | | Poor-tacky composition |
| Comparative Example 2 (5 weight % phosphite) | 3 | 5 times | Good-little or no tackiness |

These results clearly show that photocurable composition used in Comparative Example 2 is at least 5 times more efficient than the photocurable composition used in Comparative Example 1.

COMPARATIVE EXAMPLE 3

A non-inventive photocurable mixture was prepared by dissolving Irgacure® 819 (1 weight %, 140 mg) in ethoxylated (20) trimethylolpropane triacrylate (14 g, SR 415 from Sartomer). This photocurable composition was then coated onto a glass plate and exposed in air to output from an Hg light source. The cure efficiency was measured in terms of total dose required to attain crosslinking and the results are summarized in TABLE II below.

COMPARATIVE EXAMPLE 4

A photocurable composition was prepared by dissolving triisopropyl phosphite (5 weight %, 0.700 g) and Irgacure® 819 (1 weight %, 140 mg) in ethoxylated (20) trimethylolpropane triacrylate (14 g, SR 415 from Sartomer). This photocurable composition was then coated onto a glass plate and exposed to light from an Hg light source in air. Cure efficiency was measured in terms of total dose required to attain complete crosslinking and the results are summarized in TABLE II below.

COMPARATIVE EXAMPLE 5

A photocurable composition was prepared by dissolving triisopropyl phosphite (10 weight %, 1.4 g) and Irgacure® 819 (1 weight %, 140 mg) in ethoxylated (20) trimethylolpropane triacrylate (14 g, SR 415 from Sartomer). This photocurable composition was then coated onto a glass plate and exposed to light from an Hg light source in air. Cure efficiency was measured in terms of total dose required to attain complete crosslinking. The results are summarized in TABLE II below.

TABLE II

| Photocuring Efficiency in Air | | | |
|---|---|---|---|
| | Dose mJ/cm² | Efficiency Gain | Curing Degree |
| Comparative Example 3 (no phosphite) | 20 | | Poor-tacky composition |
| Comparative Example 4 (5 weight % phosphite) | 0.4 | 50 times | Good-little or no tackiness |
| Comparative Example 5 (10 weight % phosphite) | 0.2 | 100 times | Good-little or no tackiness |

These results also show the considerable improvement in photocuring in air when the photocurable compositions of Comparative Examples 4 and 5 was used compared to the Comparative Example 3 composition that did not contain a phosphite.

COMPARATIVE EXAMPLE 6

A photocurable composition was prepared by dissolving Irgacure® 369 (1 weight %, 140 mg) in ethoxylated (20) trimethylolpropane triacrylate (14 g, SR 415 from Sartomer). This photocurable compound was then coated onto a glass plate and exposed in air to output from an Hg light source. The cure efficiency was measured in terms of total dose required to attain crosslinking and the results are summarized in TABLE III below.

COMPARATIVE EXAMPLE 7

A photocurable composition was prepared by dissolving triethyl phosphite (5 weight %, 0.700 g) and Irgacure® 369 (1 weight %, 140 mg) in ethoxylated (20) trimethylolpropane triacrylate (14 g, SR 415 from Sartomer). This photocurable composition was then coated onto a glass plate and exposed to light from an Hg light source in air. Cure efficiency was measured in terms of total dose required to attain complete crosslinking and the results are summarized in TABLE III below.

TABLE III

| Photocuring Efficiency in Air | | | |
|---|---|---|---|
| | Dose mJ/cm² | Efficiency Gain | Curing Degree |
| Comparative Example 6 (no phosphite) | 42 | | Poor-tacky composition |
| Comparative Example 7 (5 weight % phosphite) | 2 | 21 times | Good-little or no tackiness |

These results also show the considerable improvement in photocuring in air when the photocurable composition of Comparative Example 7 was used compared to the Comparative Example 6 composition that did not contain a phosphite.

Invention Example 1

Photoinitiator and Photocurable Compositions

A photocurable composition of this invention was prepared by dissolving a photoinitiator composition of triethyl phosphite (5 weight %, 0.700 g), Irgacure® 369 (1 weight %, 140 mg), and 2-methoxybenzaldehyde in ethoxylated (20) trimethylolpropane triacrylate (14 g, SR 415 from Sartomer). This photocurable composition was then coated onto a glass plate to form a useful article and exposed to light from an Hg light source in air. Cure efficiency was measured in terms of total dose required to attain complete crosslinking and the results are summarized in TABLE IV below.

Invention Example 2

Black Photocurable Ink on Article

Black Pearl 880 carbon black pigment (Degussa, 4 weight %, 0.4 g), Solsperse® 3900 dispersant (Lubrizol, 2 weight %, 0.2 g) and propoxylated neopentyl glycol diacrylate SR9003 (Sartomer, 34 weight % 3.4 g) were ball milled (using 2 mm diameter ceramic beads). After ball milling, additional SR9003 (Sartomer, 45 weight %, 4.5 g) and polyester acrylate CN2283 (Sartomer, 5 weight %, 0.5 g) were added to the pigment dispersion. The average particle size of the carbon black pigment was about 300 nm. A mixture of photoinitiators, Genocure BDMM (Rahn USA Corp., 4 weight %, 0.4 g), Genocure EHA (Rahn USA Corp., 2.5 weight %, 0.25 g), Genocure ITX (Rahn USA Corp., 1 weight %, 0.1 g), and Genocure PBZ (Rahn USA Corp., 2.5 weight %, 0.25 g), was added to the carbon black dispersion and stirred overnight in the dark. Triethylphosphite (5 weight %) and 4-methoxybenzaldehyde (4 weight %) were then added to the carbon black dispersion and mixed thoroughly. A test patch (about 1 μm thick) was coated on a glass plate to provide a useful article and then exposed to curing radiation in the presence of oxygen (in air). The cure efficiency of the ink patch was evaluated based on tackiness of the ink patch after irradiation.

Invention Example 3

Yellow Photocurable Ink on Article

Yellow pigment PY-185 (BASF, 4 weight %, 0.4 g), Solsperse® 13240 dispersant (Lubrizol, 4 weight %, 0.4 g), and 2-ethylhexyl acrylate (Aldrich, 30.1 weight % 3.1 g) were ball milled (using 2 mm diameter ceramic beads). After ball milling, additional SR9003 (Sartomer, 46 weight %, 4.6 g) and polyester acrylate CN2283 (Sartomer, 5 weight %, 0.5 g) were added to the pigment dispersion. The average particle size of the yellow pigment was about 300 nm. A mixture of photoinitiators, Genocure BDMM (Rahn USA Corp., 4 weight %, 0.39 g), Genocure EHA (Rahn USA Corp., 2.5 weight %, 0.26 g), Genocure ITX (Rahn USA Corp., 1 weight %, 0.1 g), and Genocure PBZ (Rahn USA Corp., 2.5 weight %, 0.25 g), was added to the pigment dispersion that was then stirred overnight in the dark. Triethylphosphite (5 weight %) and 4-methoxybenzaldehyde (4 weight %) were added and mixed thoroughly. A test patch (about 1 μm thick) was coated onto a glass plate to provide a useful article and then exposed to curing radiation in air. The cure efficiency of the photocurable ink patch was evaluated based on tackiness of the ink patch after irradiation.

COMPARATIVE EXAMPLE 8

Photoresist Article

Poly(methyl methacrylate-co-methacrylic acid) (50:50, Eudragit® L100, acid value of 300-330 mg KOH per g, 3 g, ~16 weight %) was dissolved in 1-methoxy-2-propanol (10 g, ~54 weight %). To this solution, Irgacure® 369 (CIBA, ~2.7 weight %, 0.5 g) was added and mixed thoroughly. Dipentaerythritol pentaacrylate (SR 399, 16 weight %, 3 g) and ethoxylated trimethylolpropane triacrylate (SR9035, ~11 weight %, 2 g) were added to the resulting formulation that was mixed completely to provide a photocurable negative-working photoresist composition. This composition was spin-coated onto a glass plate and dried at 70° C. on a hot plate for 5 minutes and then exposed to UV light through a step tablet (14 steps, each step corresponding to 0.15 density change). After exposure, the article was developed in aqueous $Na_2CO_3$ (1 weight %) solution for 45 seconds. The cure efficiency was evaluated based on number of steps developed for a given dose of light exposure.

Invention Example 4

Photoresist Article

Poly(methyl methacrylate-co-methacrylic acid) (50:50, Eudragit® L100, acid value of 300-330 mg KOH per g, 3 g, ~16 weight %) was dissolved in 1-methoxy-2-propanol (10 g, ~54 weight %). To this solution, Irgacure® 369 (CIBA, ~2.7 weight %, 0.5 g) was added and mixed thoroughly. Dipentaerythritol pentaacrylate (SR 399, 16 weight %, 3 g) and ethoxylated trimethylolpropane triacrylate (SR9035, ~41 weight %, 2 g), a mixture of 4-methoxybenzaldehyde (1.0 g, ~5 weight %) and triethylphosphite (1.0 g, ~5 weight %) were added to the resulting formulation that was mixed completely to provide an inventive photocurable negative-working photoresist composition. This composition was spin-coated onto a glass plate and dried at 70° C. on a hot plate for 5 minutes and then exposed to UV light through a step tablet (14 steps, each step corresponding to 0.15 density change). After exposure, the article was developed in aqueous $Na_2CO_3$ (1 weight %) solution for 45 seconds. The cure efficiency was evaluated based on number of steps developed for a given dose of light exposure.

TABLE IV

| | Dose mJ/cm² | # of Steps Developed | Efficiency Gain |
|---|---|---|---|
| Comparative Example 8 (Photoresist with no phosphite or aldehyde) | 510 | 10 | |
| Invention Example 4 (Photoresist with phosphite & aldehyde, total 10 wt. %) | 170 | 10 | 3 times |

The results shown in TABLE IV clearly demonstrate that compared to the photoresist of Comparative Example 8, the speed of the photoresist in Inventive Example 4 was increased by a factor of 3. Thus, the photoinitiator composition and photocurable composition of this invention can provide significant curing efficiency improvements.

The invention has been described in detail with particular reference to certain preferred embodiments thereof, but it will be understood that variations and modifications can be effected within the spirit and scope of the invention.

The invention claimed is:

1. An article comprising a photocurable composition that comprises a photoinitiator composition that consists essentially of at least one photoinitiator, at least one organic phosphite, at least one aldehyde; and at least one photocurable compound,
wherein:
the at least one aldehyde is an alkyl or aryl aldehyde having one or more aldehyde moieties and has the formula R"—CHO wherein R" is a substituted or unsubstituted alkyl or aryl group;
the organic phosphite is present in the photoinitiator composition in a molar ratio to the aldehyde moieties of at least 1:1 and up to and including a molar ratio of 4:1; and
the photoinitiator is one or more of a benzoin, aryl ketone, α-amino ketone, mono- or bis(acyl)phosphine oxide, benzoin alkyl ether, benzil ketal, phenylglyoxalic ester or derivatives thereof, per-ester, ketosulfone, phenylglyoxylate, borate, and a metallocene.

2. The article of claim 1 further comprising a substrate on which the photocurable composition is disposed as a varnish coating.

3. The article of claim 2 wherein the photocurable composition is disposed on the substrate in a pattern.

4. The article of claim 2 wherein the photocurable composition is disposed on the substrate in an imagewise pattern.

5. The article of claim 2 wherein the photocurable composition is disposed on the substrate uniformly.

6. The article of claim 1 that is a printed circuit board precursor.

7. The article of claim 1 wherein the organic phosphite is represented by the Structure (I) or (II):

(I)

wherein the multiple R' groups are the same or different substituted or unsubstituted alkyl groups or HO[{CH(R)}$_x$O]$_y$ groups wherein the multiple R groups are the same or different and can be hydrogen atoms or substituted or unsubstituted alkyl groups, or two R' groups can form a cyclic aliphatic ring or fused ring system,

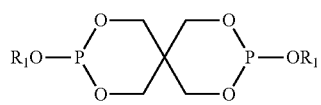
(II)

wherein the two $R_1$ groups are the same or different substituted or unsubstituted alkyl groups or HO[{CH(R)}$_x$O]$_y$ groups wherein the multiple R groups are the same or different and can be hydrogen atoms or substituted or unsubstituted alkyl groups, or the two $R_1$ groups can form a substituted or unsubstituted cyclic aliphatic ring or fused ring system, and
x is a number at least 2 and up to and including 20, and y is at least 1 and up to and including 20.

8. The article of claim 7 wherein the multiple R' groups are the same or different alkyl groups having 1 to 10 carbon atoms or HO[{CH(R)}$_x$O]$_y$ groups wherein the multiple R groups are hydrogen atoms, x is an integer of at least 2 and up to and including 10, and y is an integer of at least 1 and up to and including 10.

9. The article of claim 1 comprising one or more of trimethyl phosphite, triethyl phosphite, tripropyl phosphite, tributyl phosphite, triisobutyl phosphite, triamyl phosphite, trihexyl phosphite, trinonyl phosphite, tri-(ethylene glycol) phosphite, tri-(propylene glycol) phosphite, tri(isopropylene glycol) phosphite, tri-(butylene glycol) phosphite, tri-(isobutylene glycol) phosphite, tri-(pentylene glycol) phosphite, tri-(hexylene glycol) phosphite, tri-(nonylene glycol) phosphite, tri-(diethylene glycol) phosphite, tri-(triethylene glycol) phosphite, tri-(polyethylene glycol) phosphite, tri-(polypropylene glycol) phosphite, and tri-(polybutylene glycol) phosphite.

10. The article of claim 1 wherein the aryl aldehyde is a substituted or unsubstituted benzaldehyde or naphthaldehyde, and the alkyl aldehyde has a substituted or unsubstituted, cyclic or non-cyclic alkyl group having 1 to 20 carbon atoms.

11. The article of claim 1 wherein the photocurable composition further comprises a photosensitizer for the photoinitiator that is selected from the group consisting of ketocoumarins, benzophenones, xanthones, thioxanthones, arylketones, and polycyclic aromatic hydrocarbons.

12. The article of claim 1 wherein the photocurable composition is present on a coated or uncoated polymeric film substrate in a printed pattern.

13. The article of claim 1 wherein the total amount of photoinitiators in the photocurable composition is generally at least 2 weight % and up to and including 80 weight %, based on the total weight of photoinitiator and organic phosphite, and the molar ratio of organic phosphite to photoinitiator is at least 0.5:1 and up to and including 50:1.

14. The article of claim 1 wherein the organic phosphite is present in the photocurable composition in a molar excess to the aldehyde moieties.

15. An article having a photocured composition, which article is obtained by irradiating the photocurable composition in the article of claim 1.

16. The article of claim 15 that is a printed pattern having a photocured image.

17. The article of claim 1, wherein the at least one aldehyde is 4-methoxybenzaldehyde, 4-methylbenzaldehyde, terephthalaldehyde, 2,5-dimethoxy-1,4-benzenedicarboxaldehyde, naphthalene-1,4-dicarboxaldehyde, acetaldehyde, propionaldehyde, butyraldehyde, 2-methylbutyraldehyde, cyclohexanecarboxaldehyde, or cyclopentanecarboxaldehyde.

18. An article comprising a photocurable composition that consists essentially of a mixture of at least one photoinitiator, at least one organic phosphite, and at least one aldehyde,
wherein:
the at least one aldehyde is an alkyl or aryl aldehyde having one or more aldehyde moieties and has the formula R"—CHO wherein R" is a substituted or unsubstituted alkyl or aryl group;
the organic phosphite is represented by the Structure (I) or (II):

(I)

wherein the multiple R' groups are the same or different substituted or unsubstituted alkyl groups, or two R' groups can form a cyclic aliphatic ring or fused ring system,

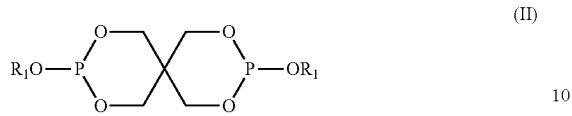

(II)

wherein the two $R_1$ groups are the same or different substituted or unsubstituted alkyl groups, or the two $R_1$ groups can form a substituted or unsubstituted cyclic aliphatic ring or fused ring system;

the organic phosphite is present in the photocurable composition in a molar excess to the aldehyde moieties and up to and including a molar ratio of 4:1, and the photoinitiator is one or more of a benzoin, aryl ketone, α-amino ketone, mono- or bis(acyl)phosphine oxide, benzoin alkyl ether, benzil ketal, phenylglyoxalic ester or derivatives thereof, per-ester, ketosulfone, phenylglyoxylate, borate, and a metallocene.

\* \* \* \* \*